(12) United States Patent
Wakita et al.

(10) Patent No.: US 8,530,755 B2
(45) Date of Patent: Sep. 10, 2013

(54) WIRING BOARD AND METHOD FOR MANUFACTURING THE SAME

(75) Inventors: Hideyuki Wakita, Ogaki (JP); Akihide Kawaguchi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 359 days.

(21) Appl. No.: 13/012,267

(22) Filed: Jan. 24, 2011

(65) Prior Publication Data

US 2011/0240351 A1   Oct. 6, 2011

Related U.S. Application Data

(60) Provisional application No. 61/319,573, filed on Mar. 31, 2010.

(51) Int. Cl.
*F23Q 7/00* (2006.01)
(52) U.S. Cl.
USPC ........... 174/264; 174/262; 174/257; 361/751; 29/842; 29/852
(58) Field of Classification Search
USPC ......... 174/255, 257, 258, 261–266; 361/748, 361/750, 751; 29/829–831, 842, 846, 847, 29/852, 853
See application file for complete search history.

(56) References Cited

U.S. PATENT DOCUMENTS

| | | | |
|---|---|---|---|
| 6,376,052 B1 * | 4/2002 | Asai et al. | 428/209 |
| 2007/0012475 A1 * | 1/2007 | Kawaguchi et al. | 174/255 |
| 2008/0107863 A1 * | 5/2008 | Ikeda et al. | 428/137 |
| 2010/0218983 A1 * | 9/2010 | Furuta et al. | 174/257 |

FOREIGN PATENT DOCUMENTS

| | | |
|---|---|---|
| JP | 2001-210952 | 8/2001 |
| JP | 2008-251638 | 10/2008 |
| WO | WO 2006/046510 A1 | 5/2006 |

OTHER PUBLICATIONS

U.S. Appl. No. 13/012,873, filed Jan. 25, 2011, Wakita, et al.

\* cited by examiner

*Primary Examiner* — Hoa C Nguyen
(74) *Attorney, Agent, or Firm* — Oblon, Spivak, McClelland, Maier & Neustadt, L.L.P.

(57) ABSTRACT

A wiring board including a core insulation layer having a connection conductor formed in a hole of the core layer, and an interlayer insulation layer laminated on one side of the core layer. The conductor of the core layer includes plating filling the hole of the core layer. The interlayer layer has a connection conductor formed in a hole of the interlayer layer. The conductor of the interlayer layer includes plating filling the hole of the interlayer layer. The conductor of the interlayer layer is stacked on the conductor of the core insulation layer. The conductors of the core and interlayer layers have lands formed on the core and interlayer layers and including metal foils and plating on the foils. The foil of the land on the core layer has a thickness which is thicker than a thickness of the foil of the land on the interlayer layer.

21 Claims, 24 Drawing Sheets

FIG.7

|  | Percentage of Cracks (%) | |
| --- | --- | --- |
|  | Eight-Layer Sample | 10-Layer Sample |
| Fourth Layer |  | 0 |
| Third Layer | 0 | 0 |
| Second Layer | 0 | 0 |
| First Layer | 7.5 | 8.4 |
| Core | 92.5 | 91.6 |

WIRING BOARD AND METHOD FOR MANUFACTURING THE SAME

CROSS-REFERENCE TO RELATED APPLICATIONS

The present application claims the benefits of priority to U.S. Application No. 61/319,573, filed Mar. 31, 2010. The contents of that application are incorporated herein by reference in their entirety.

BACKGROUND OF THE INVENTION

1. Field of the Invention

The present invention relates to a wiring board where conductive layers and interlayer insulation layers are alternately laminated at least on one side of a core insulation layer, and to a method for manufacturing such a wiring board.

2. Discussion of the Background

Japanese Laid-Open Patent Publication 2001-210952 describes a wiring board having a through-hole conductor formed by filling plating in a through hole and a via conductor formed by filling plating in a via hole. Such a through-hole conductor and via conductor are laminated vertically one over another (in a direction Z).

The contents of Japanese Laid-Open Patent Publication No. 2001-210952 are also incorporated herein by reference in their entirety in the present application.

SUMMARY OF THE INVENTION

According to one aspect of the present invention, a wiring board includes a core insulation layer having a hole and a connection conductor formed in the hole of the core insulation layer, and an interlayer insulation layer laminated on one side of the core insulation layer. The connection conductor of the core insulation layer includes a plating filling the hole of the core insulation layer. The interlayer insulation layer has a hole and a connection conductor formed in the hole of the interlayer insulation layer. The connection conductor of the interlayer insulation layer includes a plating filling the hole of the interlayer insulation layer. The connection conductor of the interlayer insulation layer is stacked on the connection conductor of the core insulation layer. The connection conductor of the core insulation layer has a land portion formed on the core insulation layer and including a metal foil and a plating on the metal foil of the land portion on the core insulation layer. The connection conductor of the interlayer insulation layer has a land portion formed on the interlayer insulation layer and including a metal foil and a plating on the metal foil of the land portion on the interlayer insulation layer. The metal foil of the land portion on the core insulation layer has a thickness which is thicker than a thickness of the metal foil of the land portion on the interlayer insulation layer.

According to another aspect of the present invention, a method for manufacturing a wiring board includes forming a metal foil on one side of a core insulation layer, forming a hole in the core insulation layer, filling the hole in the core insulation layer with a plating such that a connection conductor is formed in the core insulation layer, forming an interlayer insulation layer on the one side of the core insulation layer, forming on the interlayer insulation layer a metal foil having a thickness which is thinner than a thickness of the metal foil on the core insulation layer, forming a hole in the interlayer insulation layer such that the hole in the interlayer insulation layer is positioned on the connection conductor of the core insulation layer, and filling the hole in the interlayer insulation layer with a plating such that a connection conductor is formed in the interlayer insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7 is a chart showing simulation results regarding the percentage of cracks occurring in each layer of an eight-layer sample and a 10-layer sample;

DETAILED DESCRIPTION OF THE EMBODIMENTS

Figure 1:
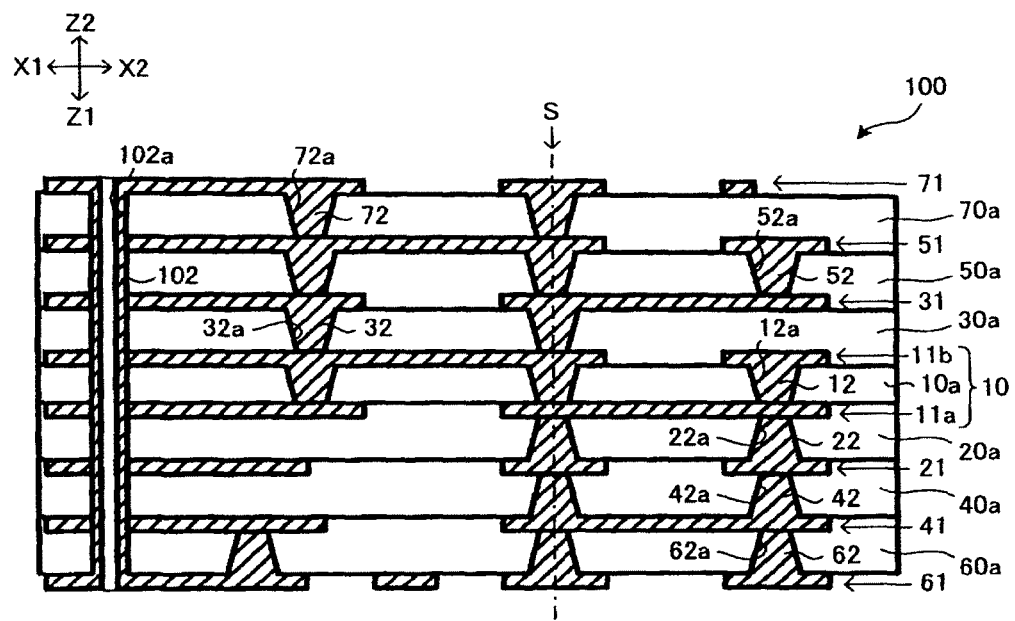
FIG. 1 is a cross-sectional view of a wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board, corresponding to a direction along a normal line (or a direction of the thickness of a core substrate) to the main surfaces (upper and lower surfaces) of the wiring board. On the other hand, arrows (X1, X2) and (Y1, Y2) each indicate a direction perpendicular to a lamination direction (directions parallel to the main surfaces of the wiring board). The main surfaces of a wiring board are on the X-Y plane. Side surfaces of a wiring board are on the X-Z plane or the Y-Z plane.

Regarding a filled conductor and its hole, a cross section perpendicular to directions Z (X-Y plane) is referred to as a horizontal cross section. Also, a cross section parallel to directions Z (X-Z plane or Y-Z plane) is referred to as a vertical cross section.

Regarding a filled conductor, a line parallel to directions Z and passing through the center of a horizontal cross section (the gravity center of each horizontal cross section if it is not a circle) is referred to as an axis. Namely, the axis direction corresponds substantially to directions Z.

In the present embodiment, two main surfaces facing opposite directions of a normal line are referred to as a first surface (the Z1-side surface) and a second surface (the Z2-side surface). Namely, a main surface opposite the first surface is the second surface, and a main surface opposite the second surface is the first surface. In lamination directions, the side closer to the core is referred to as a lower layer (or inner-layer side), and the side farther from the core is referred to as an upper layer (or outer-layer side).

Aside from a layer that includes a conductive pattern which functions as wiring such as circuits (including ground), a layer with only a plain pattern is also referred to as a wiring layer. Also, a conductor formed in a hole which penetrates through an insulation layer is referred to as a connection conductor.

Holes include a via hole and a through hole. A via hole indicates a hole which is formed by boring a hole in an insulation layer having a conductive layer on its one side (primarily a lower-side conductive layer), for example, and which reaches that conductive layer from the other side of the insulation layer. Since a conductor in a via hole (hereinafter referred to as a via conductor) is formed when a conductive layer is formed on one side of the insulation layer, the via conductor and a conductive layer at least on one side of the insulation layer are not contiguous, and an interface is formed between them. On the other hand, a through hole indicates a hole which is formed to penetrate through an insulation layer including a conductive layer when a conductive layer is formed on one side or on both sides of the insulation layer. Since a conductor formed in a through hole (hereinafter referred to as a through-hole conductor) is usually formed by plating or the like at the same time the conductive layers on both sides of an insulation layer are formed, the through-hole conductor and the conductive layers on both sides of the insulation layer are at least partially contiguous.

Among conductors formed in a hole or in a notch (such as a via conductor or a through-hole conductor), conductive film formed on wall surfaces of a hole or a notch (side and bottom surfaces) is referred to as a conformal conductor, and a conductor filled in a hole or a notch is referred to as a filled conductor. Aside from the above conductive patterns, conductive layers may also include the land of a connection conductor.

Plating indicates depositing conductors (such as metal) to form layers on metal or resin surfaces and such deposited conductive layers (such as metal layers). Other than wet plating such as electrolytic plating and electroless plating, plating also includes dry plating such as PVD (Physical Vapor Deposition) and CVD (Chemical Vapor Deposition).

Unless specifically indicated, the "width" of a hole or a cylinder (protruding portion) indicates the diameter if it is a circle, and $2\sqrt{(\text{cross sectional area}/\pi)}$ if it is other than a circle. If a hole or a cylinder (protruding portion) tapers, whether "widths" in two or more holes or protruding portions are the same or not the same may be determined by comparing the values, average values, maximum values or the like of corresponding portions.

Figure 2:
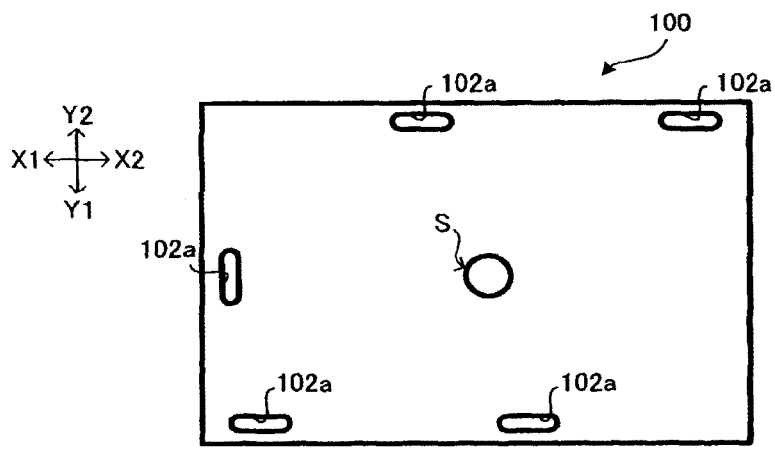
FIG. 2 is a plan view of the wiring board according to an embodiment of the present invention.

Wiring board 100 of the present embodiment is a printed wiring board. As shown in FIGS. 1 and 2, wiring board 100 has core substrate 10, insulation layers (20a, 30a, 40a, 50a, 60a, 70a), conductive layers (21, 31, 41, 51, 61, 71) and filled conductors (22, 32, 42, 52, 62, 72). Namely, on a first-surface side of core substrate 10, three insulation layers (20a, 40a, 60a) and three conductive layers (21, 41, 61) are alternately laminated. In addition, on a second-surface side of core substrate 10, three insulation layers (30a, 50a, 70a) and three conductive layers (31, 51, 71) are alternately laminated. Here, core substrate 10 corresponds to the core section. Also, insulation layers (20a-70a) etc. positioned as upper layers on the core section correspond to buildup sections.

Core substrate 10 has insulation layer (10a) (core insulation layer), conductive layers (11a, 11b) and filled conductors 12. Here, the thickness of insulation layer (10a) is 60 μm, for example. The thickness of conductive layers (11a, 11b) will be described later.

Via holes (12a) are formed in insulation layer (10a) and penetrate through insulation layer (10a). Filled conductors 12 are formed by filling plating in via holes (12a). Filled conductors 12 correspond to connection conductors. In the present embodiment, filled conductors 12 are via conductors. Since via conductors are easier to form than through-hole conductors, such a structure is advantageous for cost reduction. However, filled conductors 12 are not limited to such, and may also be through-hole conductors (see later-described FIGS. 23, 24).

Insulation layer (10a) is made of epoxy resin, for example. Epoxy resin is preferred to contain a reinforcing material such as glass fiber (glass fabric or glass non-woven fabric, for example) or aramid fiber (aramid non-woven fabric, for example) impregnated with resin, for example. The reinforcing material has a smaller thermal expansion coefficient than the primary material (epoxy resin in the present embodiment). However, the material for insulation layer (10a) is not limited to such, and any other material may be used.

Conductive layers (11a, 11b) are made of copper foil and copper plating, for example. Also, filled conductors 12 are made of copper plating, for example. Filled conductors 12 are formed to be, for example, a tapered cylinder (a truncated cone) whose diameter decreases from the second-surface side of insulation layer (10a) toward the first-surface side. A horizontal cross section (on the X-Y plane) of filled conductors 12 is a perfect circle, for example. However, filled conductors 12 are not limited to such, and may be formed in any other shape (see later-described FIGS. 18A~21B).

In the present embodiment, conductive layers (11a, 11b) have a triple-layer structure of metal foil, electroless plated film and electrolytic plated film (see later-described FIG. 22A). However, conductive layers (11a, 11b) are not limited to being a triple-layer structure, and may have a double-layer structure, for example, of metal foil and either electroless plated film or electrolytic plated film (see later-described FIG. 22B).

Insulation layer (20a) is laminated on the first-surface side of core substrate 10 and insulation layer (30a) is laminated on the second-surface side of core substrate 10. Then, conductive layer 21 is formed on the first surface of insulation layer (20a), and conductive layer 31 is formed on the second surface of insulation layer (30a). Also, insulation layer (40a) is laminated on the first-surface side of insulation layer (20a) and insulation layer (50a) is laminated on the second-surface side of insulation layer (30a). Then, conductive layer 41 is formed on the first surface of insulation layer (40a), and conductive layer 51 is formed on the second surface of insulation layer (50a). Moreover, insulation layer (60a) is laminated on the first-surface side of insulation layer (40a) and insulation layer (70a) is laminated on the second-surface side of insulation layer (50a). Then, conductive layer 61 is formed on the first surface of insulation layer (60a), and conductive layer 71 is formed on the second surface of insulation layer (70a).

Here, the thickness of insulation layers (20a, 30a, 40a, 50a) is 60 μm, for example. Also, the thickness of insulation layers (60a, 70a) is 50 μm, for example. The thickness of conductive layers (21, 31, 41, 51, 61, 71) will be described later.

Conductive layers (21, 31, 41, 51, 61, 71) are made of for example, copper foil and copper plating.

In the present embodiment, conductive layers (21, 31, 41, 51, 61, 71) have a triple-layer structure of metal foil, electroless plated film and electrolytic plated film (see later-described FIG. 22A). However, conductive layers (21, 31, 41, 51, 61, 71) are not limited to having the above triple-layer structure, and may have a double-layer structure of, for example, metal foil and either electroless plated film or electrolytic plated film (see later-described FIG. 22B).

Insulation layers (20a, 30a, 40a, 50a, 60a, 70a) correspond to interlayer insulation layers. Insulation layers (20a, 30a, 40a, 50a, 60a, 70a) are each made by impregnating a core material with resin. Inorganic material such as glass fiber or aramid fiber may be used as a core material. As for resins, for example, the following may be used: epoxy resin, polyester resin, bismaleimide triazine resin (BT resin), imide resin (polyimide), phenol resin or allyl polyphenylene ether resin (A-PPE resin) or the like.

Insulation layers (20a, 30a, 40a, 50a, 60a, 70a) have filled conductors (22, 32, 42, 52, 62, 72) (all are via conductors) formed by filling plating in their respective via holes (22a, 32a, 42a, 52a, 62a, 72a). Filled conductors (22, 32, 42, 52, 62, 72) each correspond to a connection conductor. Filled conductors (22, 32, 42, 52, 62, 72) are made of copper plating, for example. Filled conductors (22, 42, 62) are formed to be, for example, a tapered cylinder (a truncated cone) whose diameter decreases from the first-surface side of insulation layer (10a) toward the second-surface side. Horizontal cross sections (on the X-Y plane) of filled conductors (22, 42, 62) are shaped to be a perfect circle, for example. Filled conductors (32, 52, 72) are formed to be, for example, a tapered cylinder (a truncated cone) whose diameter decreases from the second-surface side of insulation layer (10a) toward the first-surface side. Horizontal cross sections (on the X-Y plane) of filled conductors (32, 52, 72) are shaped to be a perfect circle, for example. However, the shape of filled conductors 22 and others is not limited to the above, and any other shape may also be employed (see later-described FIGS. 18A~21B).

In wiring board 100, filled conductor 12 in the core section (core substrate 10) and filled conductors (22, 32, 42, 52, 62, 72) in the buildup sections are stacked, for example, along the same axis (axis Z). However, stacking filled conductors 12 and others along the same axis (axis Z) is not always required (see later-described FIGS. 14A~15C).

By the above stacked filled conductors 12 and others, filled-stack structure "S" is extended along directions Z. Adjacent filled conductors are adhered to (in contact with) each other, and are electrically continuous to each other. Filled-stack structure "S" electrically connects conductive layers on both surfaces of wiring board 100, namely conductive layer 61 on the first surface and conductive layer 71 on the second surface.

Filled-stack structure "S" has a structure where filled conductors throughout the layers are stacked, a so-called full stack structure. Accordingly, it is easier to ensure wiring space, and flexibility in designing wiring patterns increases. In addition, since wiring either in directions X or directions Y may be omitted, a reduction in wiring lengths in interlayer connections is achieved.

The positions and the number of filled-stack structures "S" are not limited specifically. For example, multiple filled-stack structures "S" may be formed (see later-described FIGS. 28A, 28B).

In wiring board 100, through holes (102a) are formed to penetrate through all insulation layers. On the wall surfaces of through holes (102a), conformal conductor 102 (throughhole conductor) made of plating, for example, is formed. Namely, through holes (102a) penetrate through wiring board 100 in directions Z (lamination directions).

In the present embodiment, conformal conductors 102 electrically connect conductive layer 61 and conductive layer 71. However, it is not always required for conformal conductors 102 to electrically connect conductive layers (conductive layers 61, 71) on both surfaces of wiring layer 100. For example, conformal conductors 102 may be electrically connected to ground lines or the like in wiring board 100, or they may be electrically independent by being insulated from all the other conductors.

In the present embodiment, conformal conductors 102 have a double-layer structure of, for example, electroless plated film and electrolytic plated film. However, conformal conductors 102 are not limited to having such a structure. For example, conformal conductors 102 could also be formed only with either electroless plated film or electrolytic plated film.

Unlike filled conductors which are formed by filling conductor in through holes (102a), conformal conductors 102 have conductor only on the wall surfaces of through holes (102a). Thus, space is formed in through holes (102a) and warping in wiring board 100 tends to be mitigated. However, the present embodiment is not limited to such and filled conductors may be used instead of conformal conductors 102.

Through holes (102a) are formed to be a cylinder, for example. The opening shape of through holes (102a) is an ellipse, for example. By setting the opening shape of through holes (102a) as an ellipse, strength in a wider region on the X-Y plane is effectively enhanced.

Through holes (102a) are positioned on the periphery of wiring board 100, for example. However, the number, opening shape, positioning and the like of through holes (102a) are not limited specifically.

Figure 3:
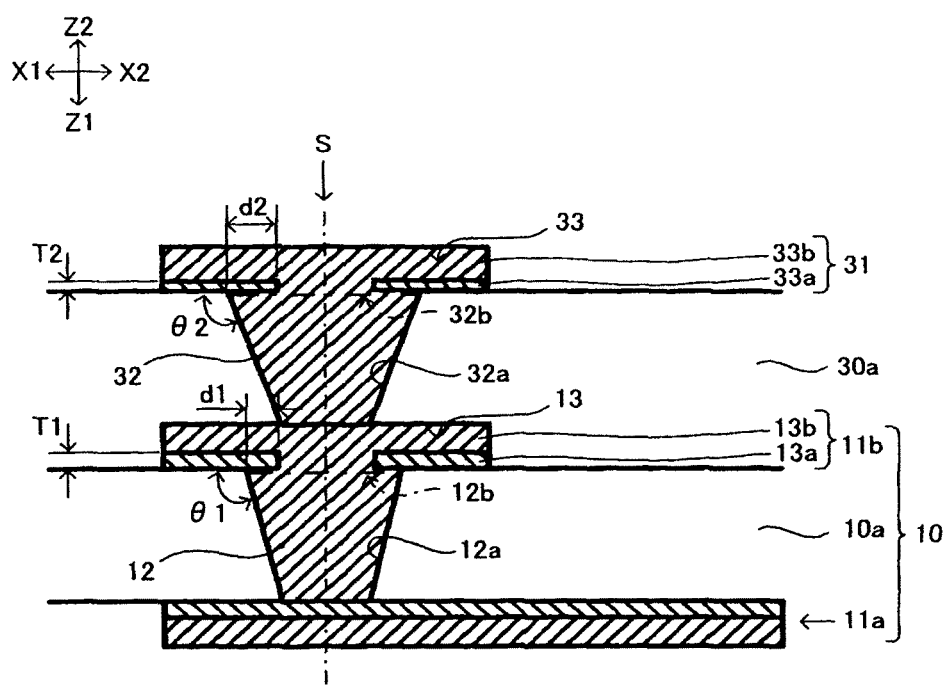
FIG. 3 is a magnified view showing part of a filled-stack structure.

FIG. 3 is an enlarged view showing part of FIG. 1, specifically, filled conductor 12 in core substrate 10 and filled conductor 32 stacked on the second surface. FIG. 3 shows a relationship between land 13 on insulation layer (10a) of core substrate 10 and land 33 on insulation layer (30a) (interlayer insulation layer). However, the relationship is the same between land 13 and lands on other interlayer insulation layers, namely, insulation layers (20a, 40a, 50a, 60a, 70a).

As shown in FIG. 3, lands 13 of filled conductors 12 are included in conductive layer (11b), and lands 33 of filled conductors 32 are included in conductive layer 31 in the present embodiment. The thickness of conductive layers (11a, 11b) of core substrate 10 is 18 μm, for example. The thickness of conductive layers (21, 31, 41, 51) laminated on both surfaces of core substrate 10 is 18 μm, for example. In addition, the thickness of outermost conductive layers (61, 71) is 25 μm, for example.

Lands 13 are formed on insulation layer (10a) (second-surface side), and lands 33 are formed on insulation layer (30a). Lands 13 are formed with metal foil (13a) (such as copper foil) and plated film (13b) made of copper, for example, formed on metal foil (13a). Also, lands 33 are formed with metal foil (33a) (such as copper foil) and plated film (33b) made of copper, for example, formed on metal foil (33a). The thickness of each of the above conductive layers equals the sum of the thickness of the metal foil and the thickness of the plated film.

In wiring board 100 of the present embodiment, metal foil (13a) of lands 13 (land on the core insulation layer) is set thicker than metal foil (33a) of lands 33 on insulation layer (30a) (interlayer insulation layer on the core insulation layer). In such a structure, since metal foil (13a) of core substrate 10 is set thicker, thermal stress near the core is mitigated by metal foil (13a) (detailed description will be provided later).

Thickness (T1) of metal foil (13a) is preferred to be 5 μm or greater, for example 7.5 μm. Thickness (T2) of metal foil (33a) is preferred to be 4.5 μm or less, for example 4.5 μm. Metal foils (13a, 33a) with such measurements may be formed by using thin copper foil. Alternatively, they may be formed by using thick copper foil and then by adjusting the thickness through etching. For example, when preparing double-sided copper-clad laminate 1000 as a starting material (see later-described FIG. 9A), if the thickness of metal foils (1001, 1002) is set at 5 μm or greater, such double-sided copper-clad laminate 1000 is easier to handle (for details, see later-described manufacturing steps) during the steps for forming filled conductors 12 and the like (see later-described FIGS. 9B, 9C).

On the other hand, plated film (13b) of lands 13 (lands on the core insulation layer) is set thinner than plated film (33b) of lands 33 on insulation layer (30a) (interlayer insulation layer on the core insulation layer). In such a structure, since plated film (13b) of core substrate 10 is set thinner, plating time to obtain necessary conductor thickness decreases when manufacturing core substrate 10. As a result, production efficiency of core substrate 10 increases.

The diameter of opening portion (12b) on the second-surface side (the side toward which the diameter increases) of via hole (12a) is 75 μm, for example. The diameter of opening portion (32b) on the second-surface side (the side toward which the diameter increases) of via hole (32a) is 75 μm, for example.

At second-surface side opening portion (32b) (the side toward which the diameter increases) of via hole (32a) in insulation layer (30a) (interlayer insulation layer on the core insulation layer), taper angle (θ2) toward the first-surface side (the side toward which the diameter decreases) is set greater than taper angle (θ1) toward the first-surface side (the side toward which the diameter decreases) at second-surface side opening portion (12b) (the side toward which the diameter increases) of via hole (12a) in insulation layer (10a). In such a structure, since the taper degree of via hole (12a) in core substrate 10 is set smaller than the taper degree of via hole (32a) in a buildup section, thermal stress caused by heat cycles is mitigated near the core where stress tends to be concentrated (detailed description will be provided later). As a result, connection reliability is enhanced between filled conductor 12 in core substrate 10 and filled conductor 32 in insulation layer (30a).

Taper angle (θ1) is approximately 110°, for example, and taper angle (θ2) is approximately 95°, for example. In addition, the difference between taper angle (θ1) and taper angle (θ2) (θ1-θ2) is approximately 15°, for example.

Figure 4A:
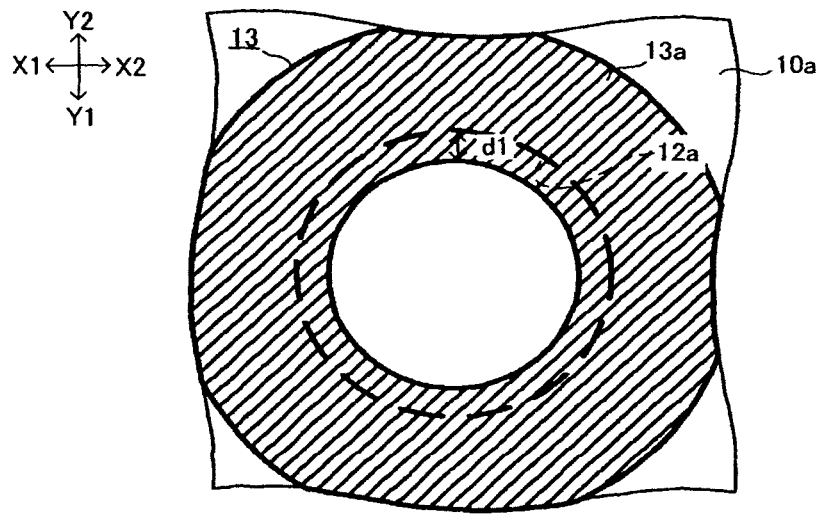
FIG. 4A is a view showing a measurement relationship between a metal foil of a land on a core insulation layer and a via hole.
Figure 4B:
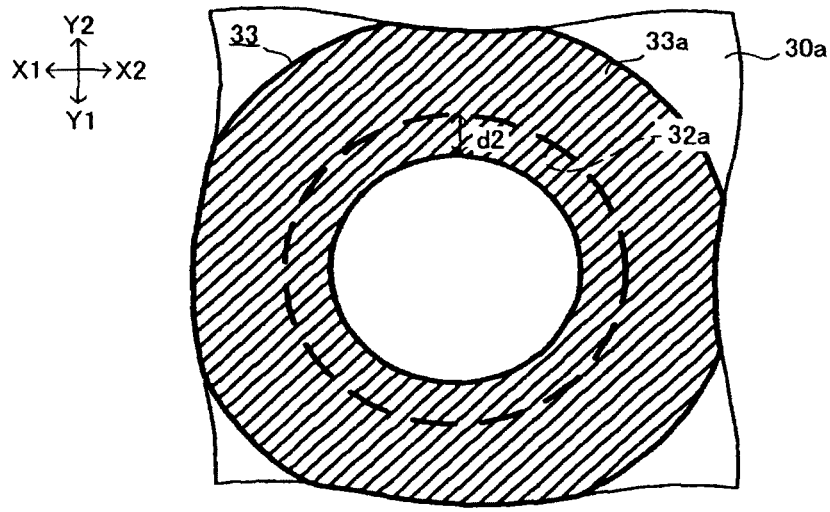
FIG. 4B is a view showing a measurement relationship between the metal foil of a land on an interlayer insulation layer on the core insulation layer and a via hole.

Also, as shown in FIGS. 4A and 4B, the amount (protruding amount d1) which metal foil (13a) of land 13 (land on the core insulation layer) protrudes inward from the periphery of via hole (12a) is set smaller than the amount (protruding amount d2) which metal foil (33a) of land 33 on insulation layer (30a) (interlayer insulation layer on the core insulation layer) protrudes inward from the periphery of via hole (32a). In such a structure, since protruding amount (d1) of metal foil (13a) on core substrate 10 is set smaller than protruding amount (d2) of metal foil (33a) on insulation layer (30a) of a buildup section, corner cracking is suppressed effectively around the core where stress tends to be concentrated (detailed description will be provided later).

Protruding amount (d1) is approximately 8.4 μm, for example, and protruding amount (d2) is approximately 13 μm, for example. In addition, the difference between protruding amount (d1) and protruding amount (d2) (d2−d1) is approximately 4.6 μm, for example. In the present embodiment, protruding amounts (d1, d2) are set substantially constant in their respective circumferential directions of via holes (12a, 32a). However, protruding amounts (d1, d2) are not limited to being set as above, and they are not required to be substantially constant in their respective circumferential directions of via holes (12a, 32a) (see later-described FIGS. 20A, 20B).

As described so far, in wiring board 100 of the present embodiment, filled conductor 12 (via conductor in a core insulation layer) and filled conductor 32 (via conductor in an interlayer insulation layer) are stacked. On insulation layer (10a) (core insulation layer) of core substrate 10, land 13 is formed, being made of metal foil (13a) and plated film (13b) formed on metal foil (13a). Also, on insulation layer (30a) (interlayer insulation layer on the core insulation layer), land 33 is formed, being made of metal foil (33a) and plated film (33b) formed on metal foil (33a). Metal foil (13a) is set thicker than metal foil (33a).

Here, metal foil (especially copper foil) is more expandable than plating (especially copper plating). Also, thermal stress exerted repeatedly by heat cycles is concentrated in the core (core substrate 10) (detailed description will be provided later). For that matter, since metal foil (13a) of core substrate 10 is set thicker in wiring board 100 of the present embodiment as described above, thermal stress around the core is mitigated by metal foil (13a). As a result, wiring board 100 becomes resistant to thermal stress.

Figure 23:
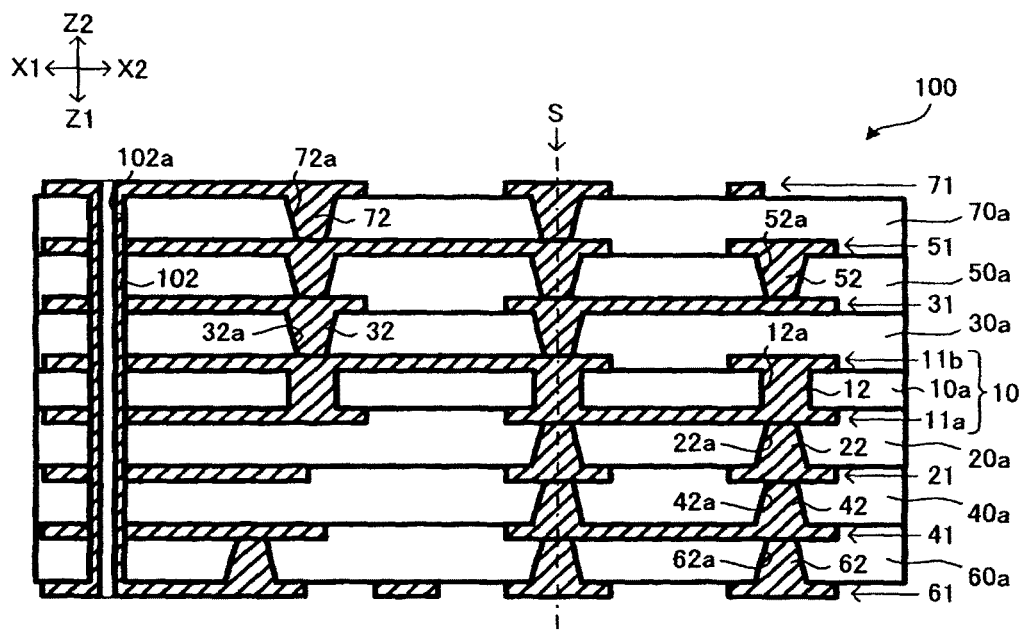
FIG. 23 is a view showing an example in which a filled conductor in a core substrate is a through-hole conductor.
Figure 24:
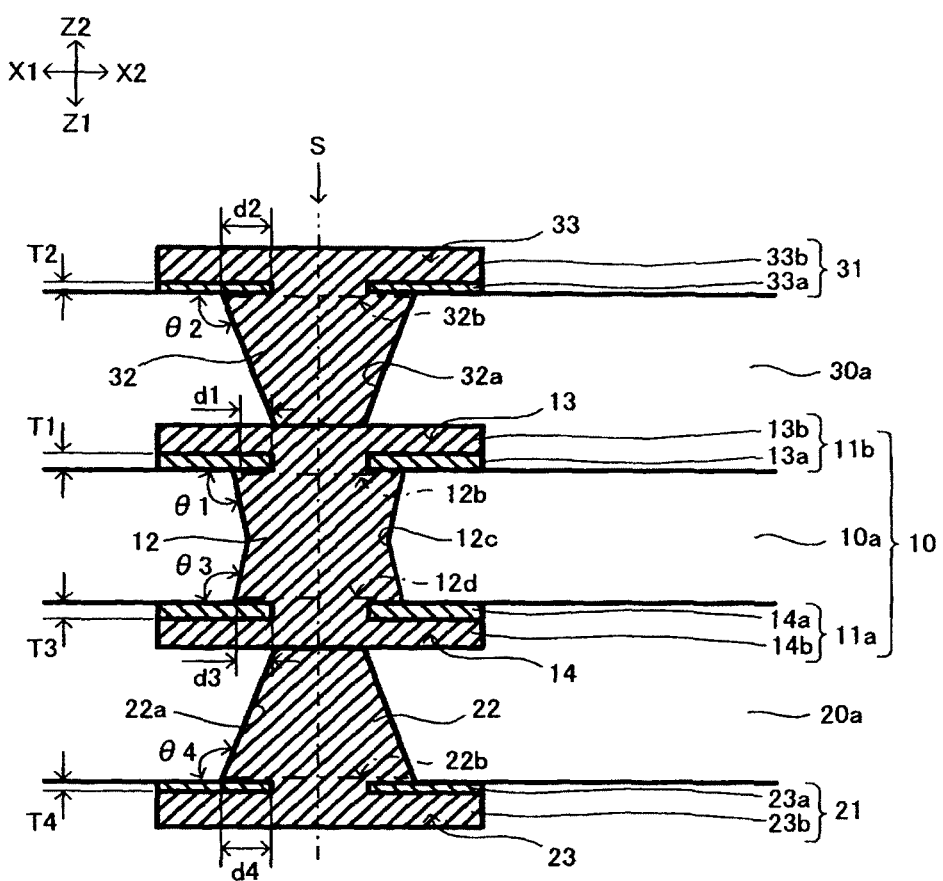
FIG. 24 is an enlarged view showing part of FIG. 23.

If filled conductors 12 are set as through-hole conductors, in addition to setting metal foil (13a) of lands 13 on the second-surface side of insulation layer (10a) to be thicker than metal foil (33a) on insulation layer (30a) which is an upper layer (second-surface side) of insulation layer (10a), the metal foil of the lands on the first-surface side of insulation layer (10a) may also be set thicker than the metal foil on insulation layer (20a) which is an upper layer (first-surface side) of insulation layer (10a) (see later-described FIGS. 23, 24).

Also, conformal conductors 102 (through-hole conductors) are formed on the wall surfaces of through holes (102a) which penetrate through all the layers of wiring board 100. Conformal conductors 102 make wiring board 100 more resistant to stress in directions Z.

The above structure works more efficiently as the number of layers (the number of conductive layers) of a wiring board increases. Especially, it is efficient if such a structure is applied to a wiring board having eight or more layers (the number of conductive layers) where three or more conductive layers and three or more insulation layers are alternately laminated on both sides of a core substrate. In the following, the reasons for such are described with reference to FIGS. 5-7.

Figure 5:
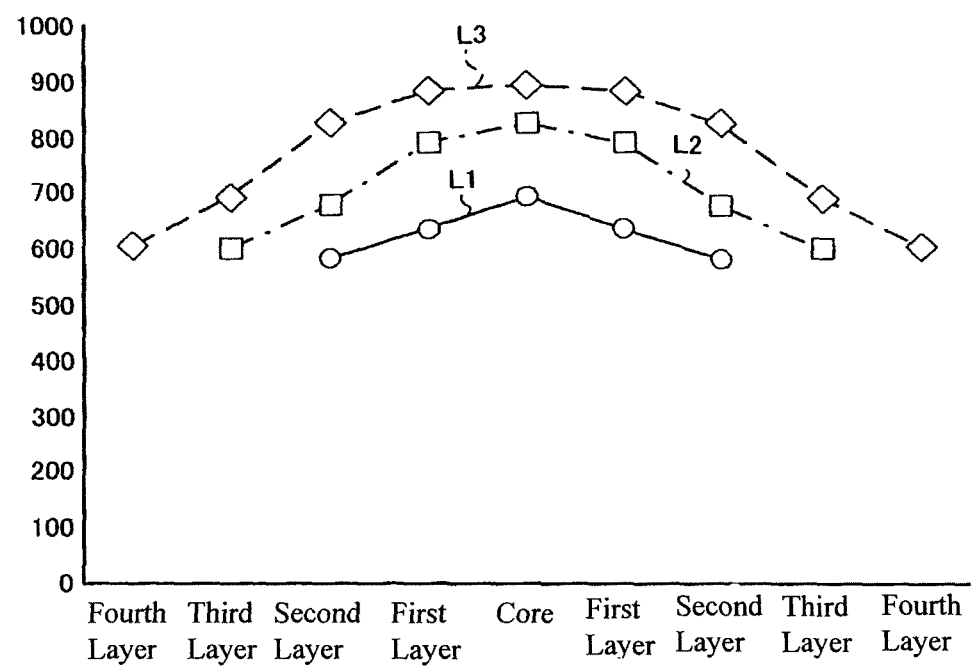
FIG. 5 is a graph showing simulation results regarding the stress exerted on wiring boards having six layers, eight layers and 10 layers.
Figure 6:
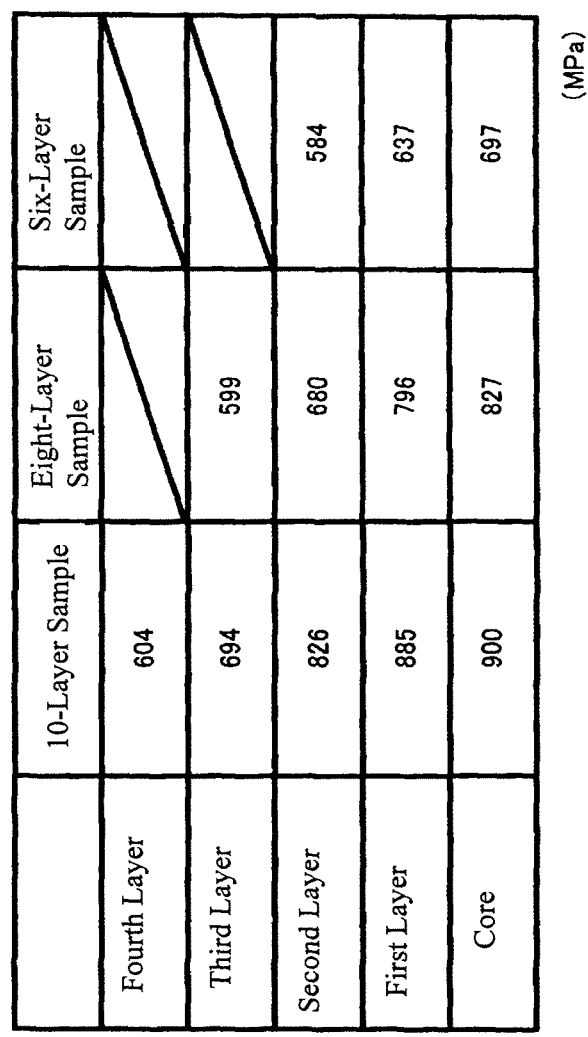
FIG. 6 is a chart showing simulation results regarding the stress exerted on wiring boards having six layers, eight layers and 10 layers.

The simulation results are shown in FIGS. 5 and 6 regarding stress (especially thermal stress caused by heat cycles) on wiring boards having six layers, eight layers and 10 layers (six-layer sample, eight-layer sample, 10-layer sample). The six-layer, eight-layer and 10-layer samples each have a full stack structure. In FIG. 5, line (L1) indicates data on a six-layer sample, line (L2) indicates data on an eight-layer sample and line (L3) indicates data on a 10-layer sample.

As shown in FIGS. 5 and 6, stress is the greatest on the core and stress decreases layer by layer away from the core in each of the six-layer, eight-layer and 10-layer samples. When stress exerted on each of the six-layer, eight-layer and 10-layer samples are compared, the stress on the 10-layer sample is the greatest, the stress on the eight-layer sample is second, and the stress on the six-layer sample is the smallest. Thus, it is assumed that stress in a wiring board would increase as the number of layers increases.

FIG. 7 shows simulation results regarding the percentage of cracks occurring in each layer of an eight-layer sample and a 10-layer sample.

As shown in FIG. 7, the majority of cracks is concentrated in the core (core substrate). Therefore, there is a concern about lowered connection reliability in the core.

In addition, as shown in FIG. 7, cracking also occurs in a first layer (insulation layer on the core substrate). Thus, if only the via conductors in the core substrate are reinforced, there is a further concern that cracks will be concentrated in the via conductors on the upper layers of a first layer. Also, since the greater the number of layers, the greater the stress on the wiring board, cracking around the core occurs more often as the number of layers of a wiring board increases.

For that matter, according to the above structure in wiring board 100 of the present embodiment, since metal foil (13a) on core substrate 10 is made thicker, thermal stress around the core is mitigated by metal foil (13a), and cracking is suppressed near the core.

Also, if conformal conductors 102 (through-hole conductors) are formed, the entire layer of wiring board 100 is reinforced evenly. Therefore, compared with situations in which core substrate 10 is locally reinforced, stress is less likely concentrated in some other portions. Accordingly, cracking is suppressed not only in core substrate 10, but also in the upper layers of core substrate 10 (insulation layers 20a~70a).

Also, since cracking is highly likely to occur in a wiring board with eight or more layers, the above structure is especially effective if employed in a wiring board having eight or more layers. Wiring board 100 of the present embodiment has eight layers (conductive layers 11a, 11b, 21, 31, 41, 51, 61, 71). However, the present embodiment is not limited to such, and it may be a wiring board having nine or more layers (for example, a wiring board with 10 layers).

As described so far, according to the above structure in wiring board 100 of the present embodiment, a printed wiring board is obtained having features such as high heat radiation, low electrical resistance and highly integrated wiring.

Figure 8:
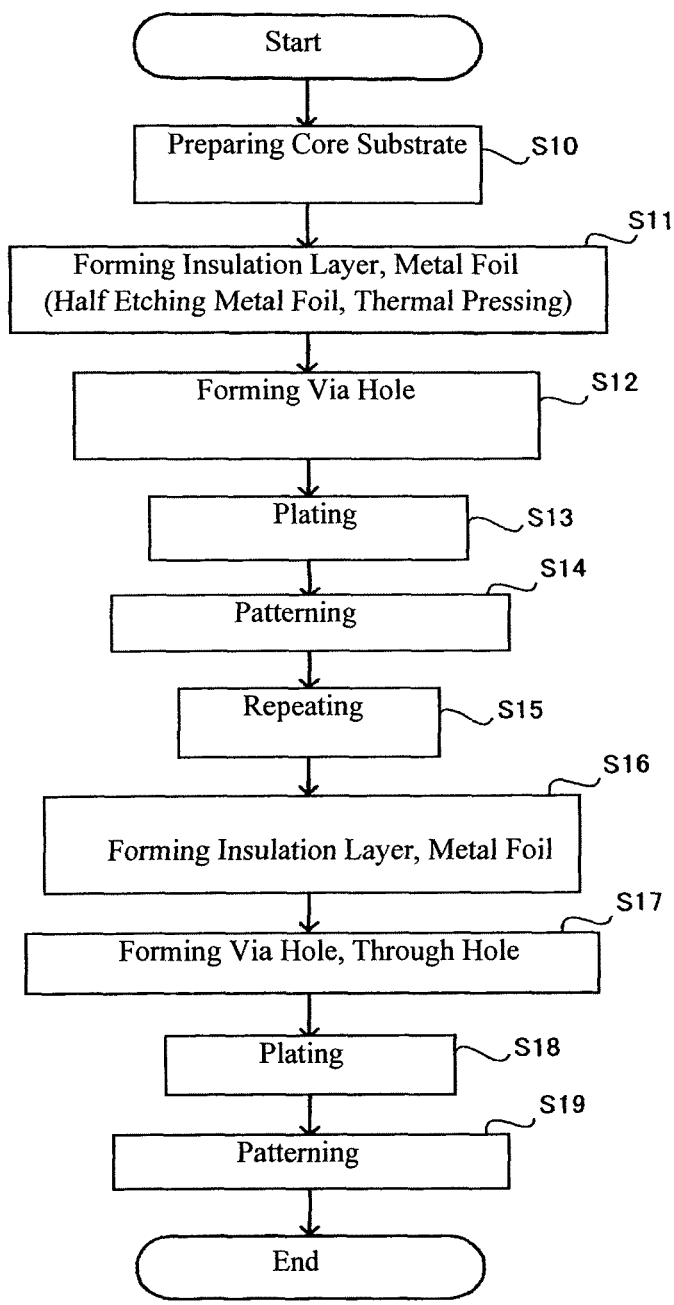
FIG. 8 is a flowchart showing a method for manufacturing a wiring board according to an embodiment of the present invention.

The above wiring board 100 is manufactured by a procedure, for example, shown in FIG. 8.

In step (S10), core substrate 10 is prepared.

A method for manufacturing core substrate 10 is shown in FIGS. 9A-9D.

Figure 9A:
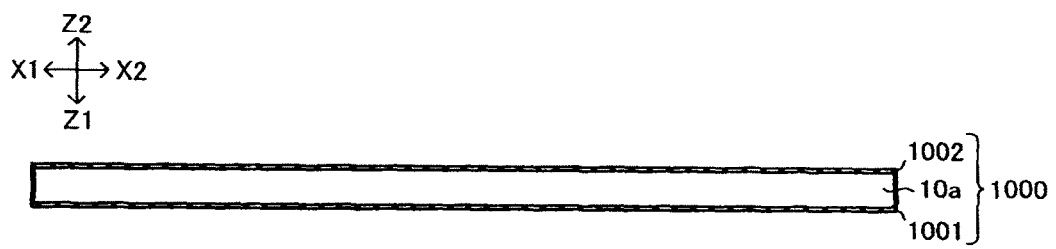
FIG. 9A is a view to illustrate a first step for preparing a core substrate.

As shown in FIG. 9A, double-sided copper-clad laminate 1000 (starting material) is prepared. Double-sided copper-clad laminate 1000 has insulation layer (10a) and metal foils (1001, 1002) (such as copper foil). Metal foil 1001 is formed on a first surface of insulation layer (10a) and metal foil 1002 is formed on a second surface of insulation layer (10a). The material for insulation layer (10a) is, for example, epoxy resin with a reinforcing material as described above.

Figure 9B:
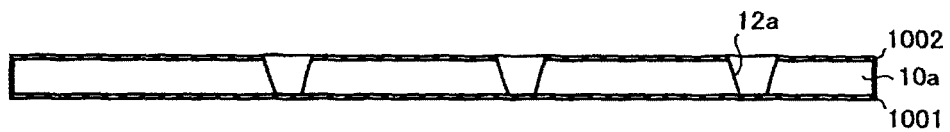
FIG. 9B is a view to illustrate a second step subsequent to the step in FIG. 9A.
Figure 9C:
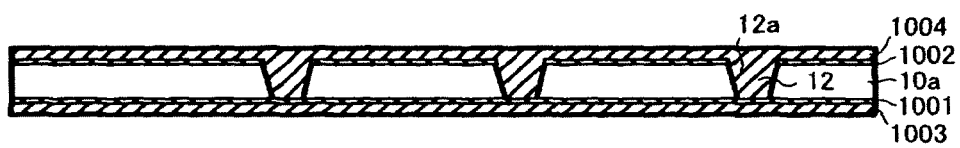
FIG. 9C is a view to illustrate a third step subsequent to the step in FIG. 9B.
Figure 9D:
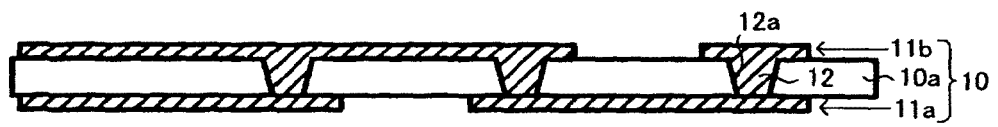
FIG. 9D is a view to illustrate a fourth step subsequent to the step in FIG. 9C.

Metal foil 1002 becomes metal foil (13a) (FIGS. 3, 4A) by being patterned in a later step (FIG. 9D). In the present embodiment, instead of adjusting the thickness by etching, for example, metal foil 1002 with a predetermined thickness (for example, 7.5 μm) may be laminated from the outset. However, forming metal foil 1002 is not limited to such, and any other method may be employed. For example, after a relatively thick metal foil (for example, 12 μm) is laminated on the insulation layer, the metal foil is half-etched to obtain metal foil 1002 with a predetermined thickness (for example, 7.5 μm).

Also, the thickness of metal foils (1001, 1002) of double-sided copper-clad laminate 1000 as a starting material is set at 5 μm or greater in the present embodiment. By setting such a thickness, the strength of double-sided copper-clad laminate 1000 is enhanced, and handling the laminate becomes easier. However, the thickness of metal foils (1001, 1002) is not limited to such a range, and it may be modified appropriately.

As shown in FIG. 9B, via holes (12a) are formed in insulation layer (10a) by a laser, for example. Via holes (12a) penetrate through metal foil 1002 and insulation layer (10a), but they do not penetrate through metal foil 1001. Accordingly, via holes (12a) are formed, reaching metal foil 1001 from the second-surface side of insulation layer (10a). Then, desmearing and soft etching are conducted if required.

As shown in FIG. 9C, performing copper panel plating (plating in via holes (12a) and on the entire surface), for example, plating 1003 is formed on the first surface of metal foil 1001 and plating 1004 is formed on the second surface of metal foil 1002 and in via holes (12a). Accordingly, via holes (12a) are filled with plating 1004. As a result, filled conductors 12 are formed. Platings (1003, 1004) are formed by, for example, performing electroless plating and then electrolytic plating using the electroless plated film as a cathode (see later-described FIG. 22A). As a plating solution for electroless plating, for example, a copper sulfate solution with an added reduction agent or the like may be used. Also, as a plating solution for electrolytic plating, for example, a copper sulfate solution, a copper pyrophosphate solution, a cyanide copper plating solution, a copper borofluoride solution or the like may be used.

As shown in FIG. 9D, conductive layers on both surfaces of insulation layer (10a) are patterned by a lithographic technique, for example. In doing so, conductive layer (11a) is formed on the first surface of insulation layer (10a) and conductive layer (11b) is formed on the second surface of insulation layer (10a). As a result, core substrate 10 is completed.

In step (S11) in FIG. 8, insulation layers and metal foils are formed on both sides of core substrate 10.

Figure 10A:
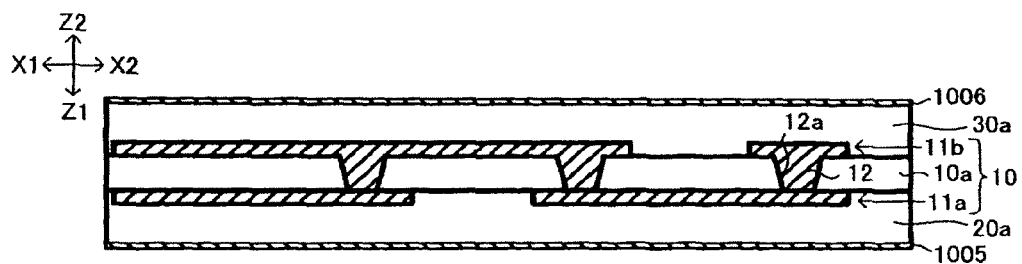
FIG. 10A is a view to illustrate a step for forming an insulation layer and a metal foil on both sides of the core substrate.

Specifically, for example, as shown in FIG. 10A, metal foil 1005 (such as copper foil), insulation layer (20a), core substrate 10, insulation layer (30a) and metal foil 1006 (such as copper foil) are arranged in that order from the first-surface side. Accordingly, a laminate is formed. In such a laminate, core substrate 10 is sandwiched by insulation layers (20a, 30a), which are then sandwiched by metal foils (1005, 1006). In this step, insulation layers (20a, 30a) are prepreg (semi-cured adhesive sheet). However, RCF (resin-coated copper foil) or the like may also be used instead of prepreg.

Metal foils (1005, 1006) are half-etched.

Figure 10B:
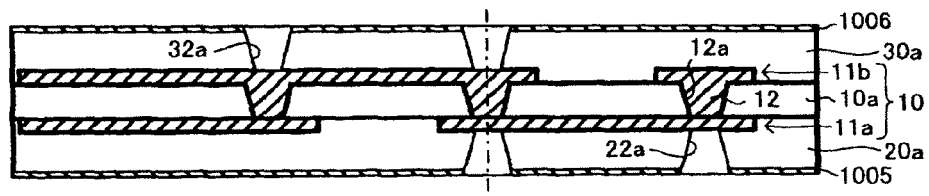
FIG. 10B is a view to illustrate a step for forming via holes subsequent to the step in FIG. 10A.
Figure 10C:
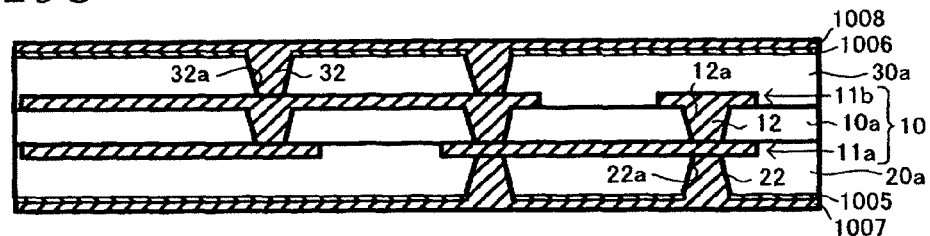
FIG. 10C is a view to illustrate a plating step subsequent to the step in FIG. 10B.
Figure 10D:
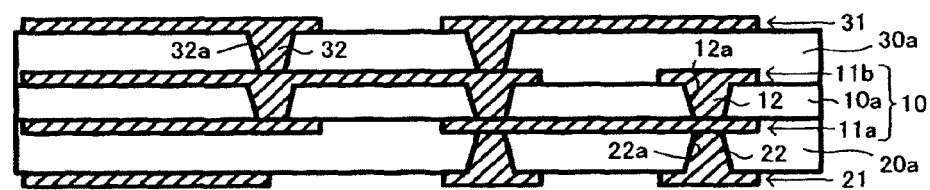
FIG. 10D is a view to illustrate a patterning step subsequent to the step in FIG. 10C.

Metal foil 1006 becomes metal foil (33a) (FIGS. 3, 4B) by being patterned in a later step (FIG. 10D). In the present embodiment, metal foil 1006 is obtained with a predetermined thickness (for example, 4.5 μm) by half-etching before later-described pressing. Metal foil 1006 with a predetermined thickness may be laminated from the outset, but it is difficult to laminate thin metal foil on an insulation layer. For that matter, in the present embodiment, a relatively thick metal foil (for example, 7.5 μm, the same thickness as metal foil 1002) is laminated on the insulation layer, and then the metal foil is half-etched to a predetermined thickness (for example, 4.5 μm). Thus, metal foil 1006 with excellent quality is easily obtained. However, a method for forming metal foil 1006 is not limited specifically. For example, metal foil 1006 with a predetermined thickness (for example, 4.5 μm) may be laminated from the outset by omitting a half-etching step. Alternatively, the above half-etching may be performed after a later-described pressing.

The above laminate is thermal pressed in directions Z. Namely, pressing and heating are simultaneously performed. Prepreg (insulation layers 20a, 30a) is cured by such pressing and heating, and members are adhered to each other. As a result, the laminate becomes integrated. Here, the pressing and heating may be divided into multiple procedures. Also, heating and pressing may be conducted separately, but it is more efficient if they are conducted at the same time. After thermal pressing, another heating process for integration may be conducted separately.

In step (S12) in FIG. 8, via holes are formed in insulation layers on both sides of core substrate 10.

Specifically, as shown in FIG. 10B, for example, via holes (22a) are formed in insulation layer (20a) and via holes (32a) are formed in insulation layer (30a) by a laser, for example. Via holes (22a, 32a) to form filled-stack structure "S" are formed along the same axis (axis Z) as that of filled conductor 12 in filled-stack structure "S." If required, a black-oxide treatment is preferred before holes are bored (laser irradiation). Also, after the holes are bored, desmearing and soft etching are conducted if required.

Plating is performed in step (S13) in FIG. 8.

Specifically, as shown in FIG. 10C, by copper panel plating, for example, plating 1007 is formed on the first surface of metal foil 1005 and in via holes (22a), and plating 1008 is formed on the second surface of metal foil 1006 and in via holes (32a). Platings (1007, 1008) are formed by performing electroless plating followed by electrolytic plating using the electroless plated film as a cathode, the same as in the step in FIG. 9C, for example (see later-described FIG. 22A). Accordingly, via holes (22a, 32a) are filled with their respective platings (1007, 1008). As a result, filled conductors (22, 32) are formed. Filled conductors (22, 32) to form filled-stack structure "S" are stacked along the same axis (axis Z) as that of filled conductor 12, which is another filled conductor to form filled-stack structure "S."

Conductive layers are patterned in step (S14) in FIG. 8.

Specifically, as shown in FIG. 10D, conductive patterns on both surfaces are patterned by a lithographic technique, for example. Accordingly, conductive layer 21 is formed on the first surface of insulation layer (20a) and conductive layer 31 is formed on the second surface of insulation layer (30a).

Figure 11:
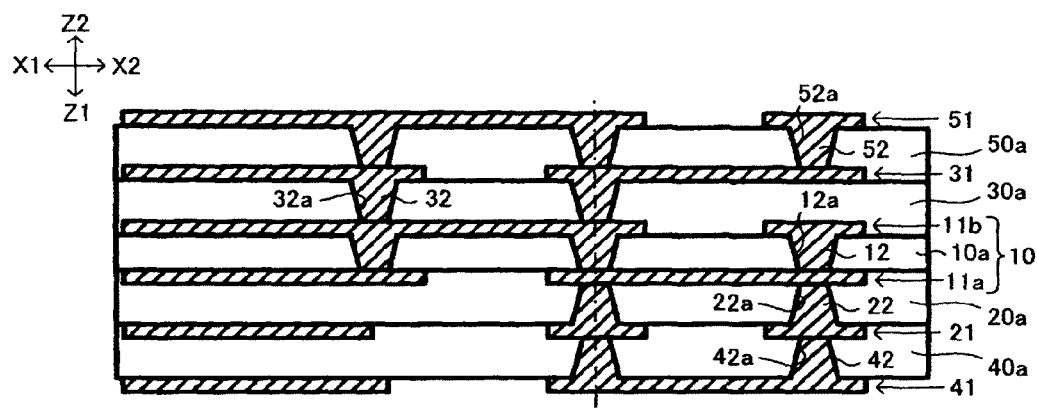
FIG. 11 is a view to illustrate a step for forming buildup layers on both sides of the core substrate subsequent to the step in FIG. 10D.

In step (S15) in FIG. 8, by repeating the steps (S11)~(S14), insulation layers (40a, 50a), via holes (42a, 52a), filled conductors (42, 52) and conductive layers (41, 51) are formed as shown in FIG. 11. Filled conductors (42, 52) to form filled-stack structure "S" are stacked along the same axis (axis Z) as those of other conductors such as filled conductor 12 which form filled-stack structure "S."

Insulation layers and metal foils are formed on both sides of core substrate 10 in step (S16) in FIG. 8.

Figure 12:
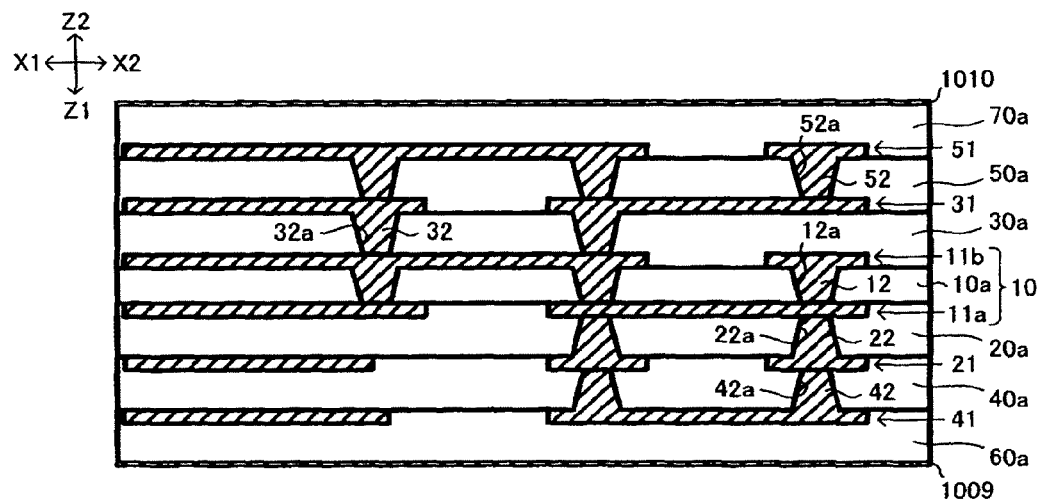
FIG. 12 is a view to illustrate a step for forming an insulation layer and a metal foil on both sides of the core substrate subsequent to the step in FIG. 11.

Specifically, as shown in FIG. 12, for example, insulation layer (60a) and metal foil 1009 (such as copper foil) are laminated on the first-surface side of core substrate 10, and insulation layer (70a) and metal foil 1010 (such as copper foil) are laminated on the second-surface side of core substrate 10.

Metal foils (1009, 1010) are half-etched if required.

The laminate is thermal pressed in directions Z. Accordingly, prepreg (insulation layers 60a, 70a) is cured, and members are adhered to each other. As a result, the laminate becomes integrated. Here, the pressing and heating treatments may be divided into multiple procedures. Also, heating and pressing may be conducted separately, but it is more efficient if they are conducted at the same time. After thermal pressing, another heating process for integration may be conducted separately.

In step (S17) in FIG. 8, via holes are formed in insulation layers on both sides of core substrate 10 along with through holes formed to penetrate through all the layers.

Figure 13A:
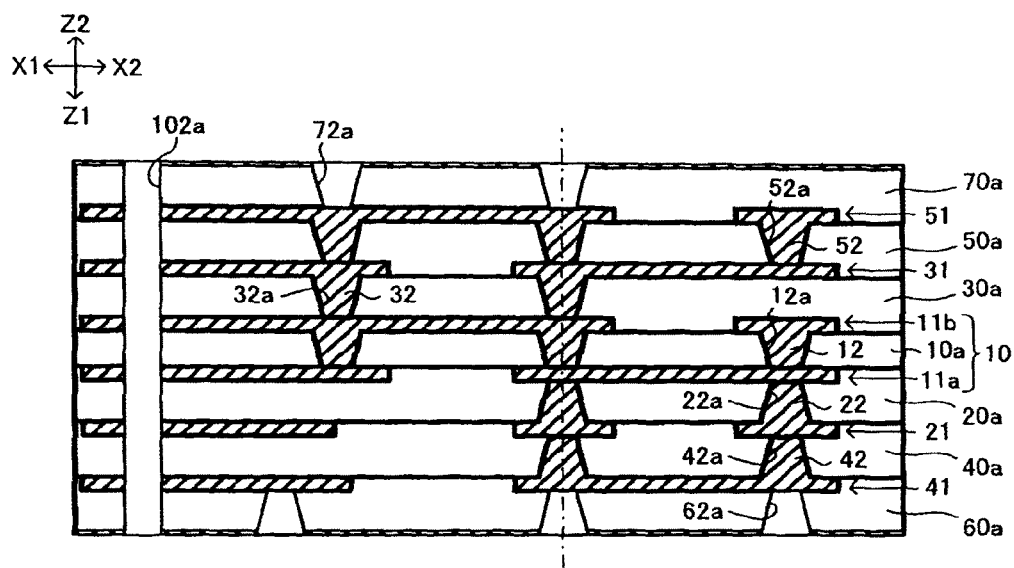
FIG. 13A is a view to illustrate a step for forming via holes and through holes subsequent to the step in FIG. 12.

Specifically, as shown in FIG. 13, via holes (62a) penetrating through insulation layer (60a), via holes (72a) penetrating through insulation layer (70a) and through holes (102a) penetrating through all the layers are formed by a laser, for example. Via holes (62a, 72a) to form filled-stack structure "S" are formed along the same axis (axis Z) as those of other conductors such as filled conductor 12 which form filled-stack structure "S." If required, a black-oxide treatment is preferred before holes are bored (laser irradiation). Also, desmearing and soft etching are conducted, if required after holes are bored.

When irradiating a laser, laser light is irradiated on the entire surface of an object while a shading mask is placed on the object, for example. However, the present embodiment is not limited to such, and instead of using a shading mask, laser light may be irradiated only on the required portions by halting irradiation at portions where irradiation is not required. Also, while scanning laser light, the laser light intensity (amount of light) for irradiating on portions to form through holes (102a) may be increased from the laser light intensity for irradiating on portions to form via holes (62a, 72a) so that via holes (62a, 72a) and through holes (102a) are formed by being scanned once. During that time, the laser intensity (amount of light) is preferred to be adjusted by pulse control. In particular, for example, when modifying laser intensity, the number of shots (irradiation number) is changed without modifying the laser intensity per shot (one irradiation). Namely, if the required laser intensity is not obtained with one shot, laser light is irradiated again on the same spot. For example, via holes (12a) in the core section (FIG. 9B) are formed by two shots, and via holes (22a, 32a, 42a, 52a, 62a, 72a) in buildup sections are formed by one shot. Then, to form through holes (102a), the number of shots is further increased. Using such a control method, throughput is enhanced, since time for changing irradiation conditions is omitted. However, a method for adjusting laser intensity is not limited specifically. For example, irradiation conditions may be determined for each irradiation spot, while the number of irradiations is set as constant (for example, one shot per irradiation spot). Through holes (102a) may be formed by irradiating laser light only from one side of core substrate 10, or by irradiating laser light simultaneously from both sides of core substrate 10. Moreover, through holes (102a) may be formed by irradiating laser light from one side of core substrate 10 to form holes with bottom portions (non-penetrating holes), and then by irradiating laser light again from the other side to penetrate through the bottom portions.

Plating is performed in step (S18) in FIG. 8.

Figure 13B:
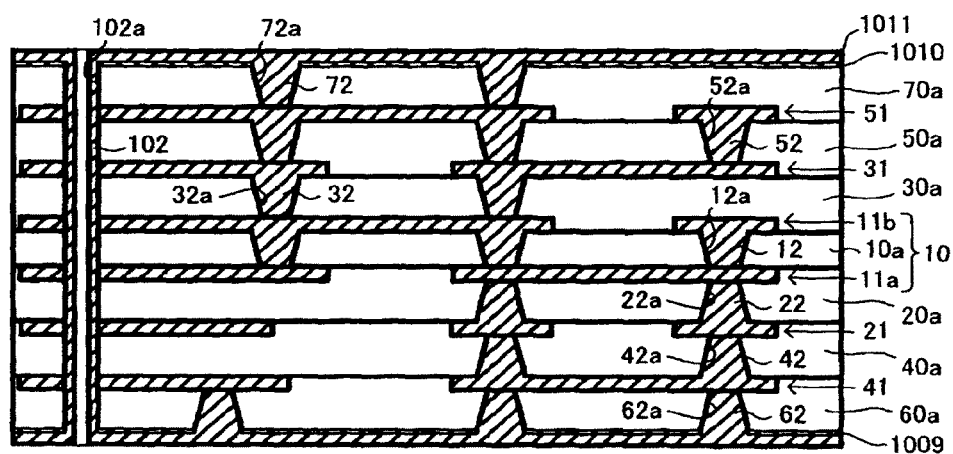
FIG. 13B is a view to illustrate a plating step subsequent to the step in FIG. 13A.

Specifically, as shown in FIG. 13B, by performing copper panel plating, for example, plating 1011 is formed on the first surface of metal foil 1009, in via holes (62a), on the second surface of metal foil 1010, in via holes (72a) and in through holes (102a). As the same step in FIG. 9C, for example, plating 1011 is formed by performing electroless plating first, which is followed by electrolytic plating using the electroless plated film as a cathode (see later-described FIG. 22A). Accordingly, plating 1011 is filled in via holes (62a, 72a), and plating 1011 is also formed on the wall surfaces of through holes (102a). As a result, filled conductors (62, 72) along with conformal conductors 102 are formed. Filled conductors (62, 72) to form filled-stack structure "S" are stacked along the same axis (axis Z) as those of other filled conductors such as filled conductor 12 to form filled-stack structure "S."

In the present embodiment, forming plating 1011 on the wall surfaces of through holes (102a) and forming plating 1011 in outermost via holes (via holes 62a, 72a) are carried out simultaneously. Therefore, a reduction in the number of steps and in cost is achieved.

In step (S19) in FIG. 8, conductive layers on both surfaces are patterned by a lithographic technique, for example. Accordingly, as previously shown in FIG. 1, conductive layer 61 is formed on the first surface of insulation layer (60a) and conductive layer 71 is formed on the second surface of insulation layer (70a). As a result, wiring board 100 is completed. Then, by forming external connection terminals on the outermost layers, for example, connecting wiring board 100 to other wiring boards or mounting electronic components on wiring board 100 is achieved through such external connection terminals (see later-described FIG. 30).

Any other method may be employed for forming conductive patterns. For example, each conductive layer may be formed by a so-called pattern plating method, in which only the portions to be patterned are selectively plated using plating resist.

So far, a wiring board and its manufacturing method according to an embodiment of the present invention are described. However, the present invention is not limited to the above embodiment.

It is not always required that filled conductors such as filled conductor 12 to form filled-stack structure "S" be stacked along the same axis (axis Z). For example, as shown in FIGS. 14A-15C, filled conductors such as filled conductor 12 may be stacked by being shifted in a direction X or in a direction Y. In each drawing, range (R11) is the opening range of via hole (12a) on the first-surface side and range (R12) is the opening range of via hole (12a) on the second-surface side.

Figure 14A:
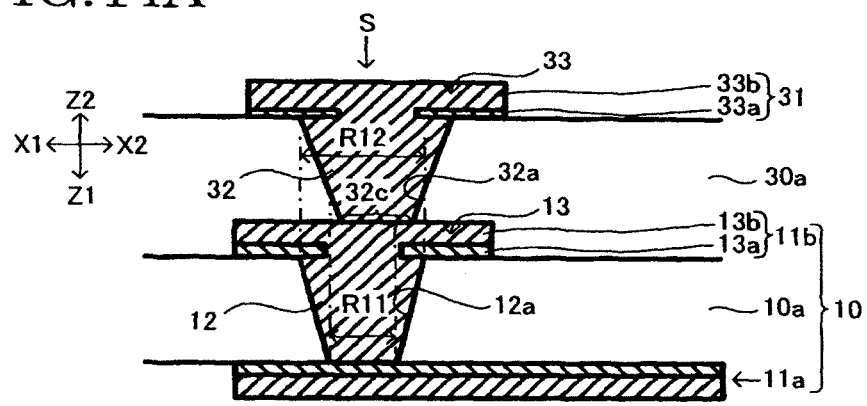
FIG. 14A is a view of a first alternative example showing a positional relationship in a filled-stack structure between a filled conductor in a core substrate and the filled conductor stacked on its second surface.
Figure 14B:
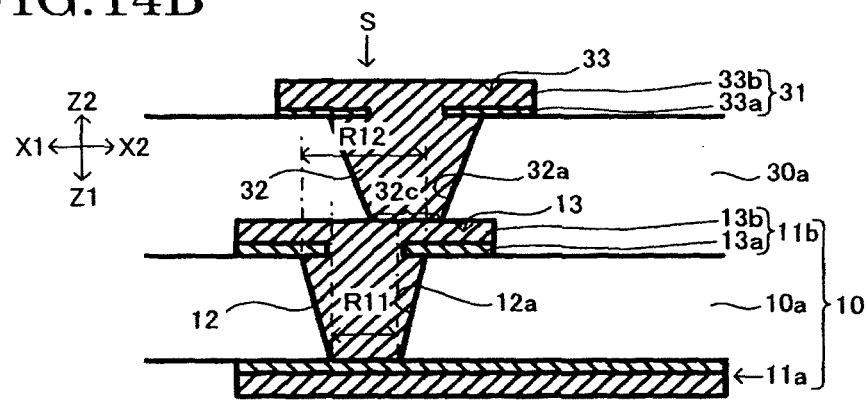
FIG. 14B is a view of a second alternative example showing a positional relationship in a filled-stack structure between a filled conductor in a core substrate and the filled conductor stacked on its second surface.
Figure 14C:
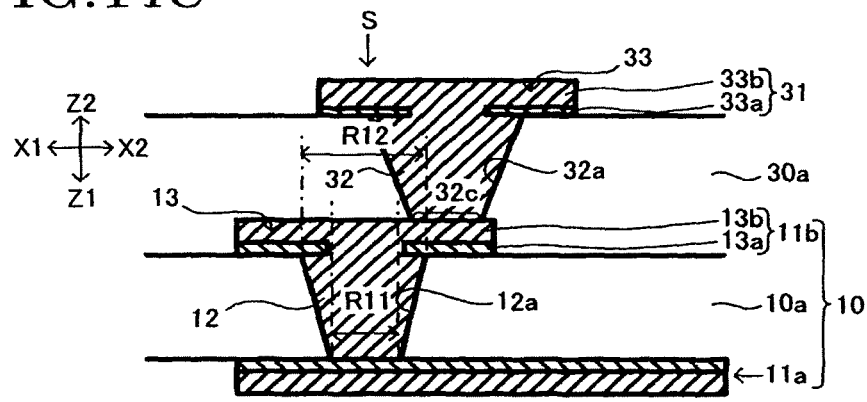
FIG. 14C is a view of a third alternative example showing a positional relationship in a filled-stack structure between a filled conductor in a core substrate and the filled conductor stacked on its second surface.

When filled conductors having the same taper direction are stacked, for example, when filled conductor 32 is stacked on the second-surface side of filled conductor 12, one edge (the inner edge) of lower-layer side end surface (32c) (the first-surface side) of filled conductor 32 may be positioned within range (R11), while the other edge (the outer edge) is positioned outside range (R11) but within range (R12) as shown in FIG. 14A. Alternatively, as shown in FIG. 14B, one edge (the inner edge) of end surface (32c) may be positioned within range (R11), while the other edge (the outer edge) is positioned outside range (R12). Yet alternatively, as shown in FIG. 14C, one edge (the inner edge) of end surface (32c) may be positioned outside range (R11) but within range (R12), while the other edge (the outer edge) is positioned outside range (R12). The same as above applies to the following: when filled conductor 52 is stacked on the second-surface side of filled conductor 32; when filled conductor 72 is stacked on the second-surface side of filled conductor 52; when filled conductor 22 is stacked on the first-surface side of filled conductor 12; when filled conductor 42 is stacked on the first-surface side of filled conductor 22; and when filled conductor 62 is stacked on the first-surface side of filled conductor 42.

Figure 15A:
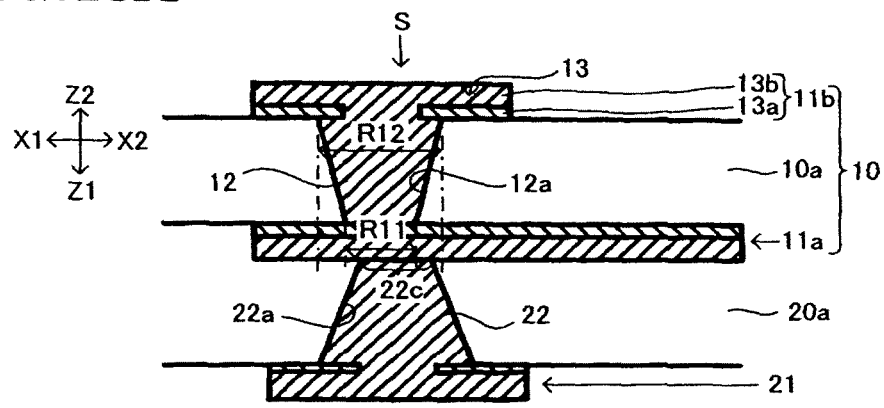
FIG. 15A is a view of a first alternative example showing a positional relationship in a filled-stack structure between a filled conductor in a core substrate and the filled conductor stacked on its first surface.
Figure 15B:
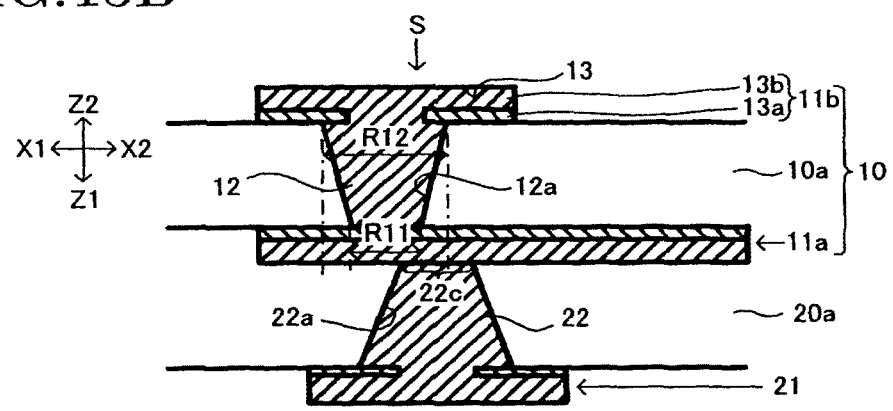
FIG. 15B is a view of a second alternative example showing a positional relationship in a filled-stack structure between a filled conductor in a core substrate and the filled conductor stacked on its first surface.
Figure 15C:
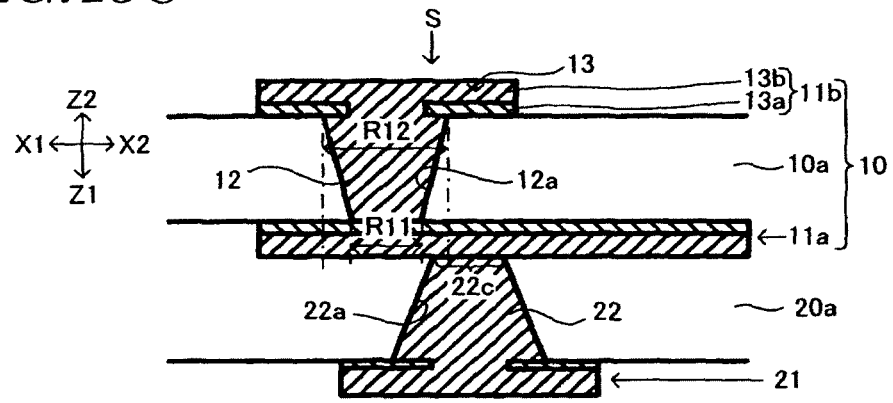
FIG. 15C is a view of a third alternative example showing a positional relationship in a filled-stack structure between a filled conductor in a core substrate and the filled conductor stacked on its first surface.

In addition, when filled conductors having opposite taper directions are stacked, for example, when filled conductor 22 is stacked on the first-surface side of filled conductor 12, one edge (the inner edge) of lower-layer side end surface (22c) (the second-surface side) of filled conductor 22 may be positioned within range (R11), while the other edge (the outer edge) is positioned outside range (R11) but within range (R12) as shown in FIG. 15A. Alternatively, as shown in FIG. 15B, one edge (the inner edge) of end surface (22c) may be positioned within range (R11), while the other edge (the outer edge) is positioned outside range (R12). Yet alternatively, as shown in FIG. 15C, one edge (the inner edge) of end surface (22c) may be positioned outside range (R11) but within range (R12), while the other edge (the outer edge) is positioned outside range (R12).

In short, it is sufficient at least as long as each filled conductor is stacked. Here, being stacked indicates that at least one edge (the inner edge) of a lower-layer side end surface of a filled conductor is positioned at least within the opening range on one side of a hole formed in the lower layer.

Figure 16:
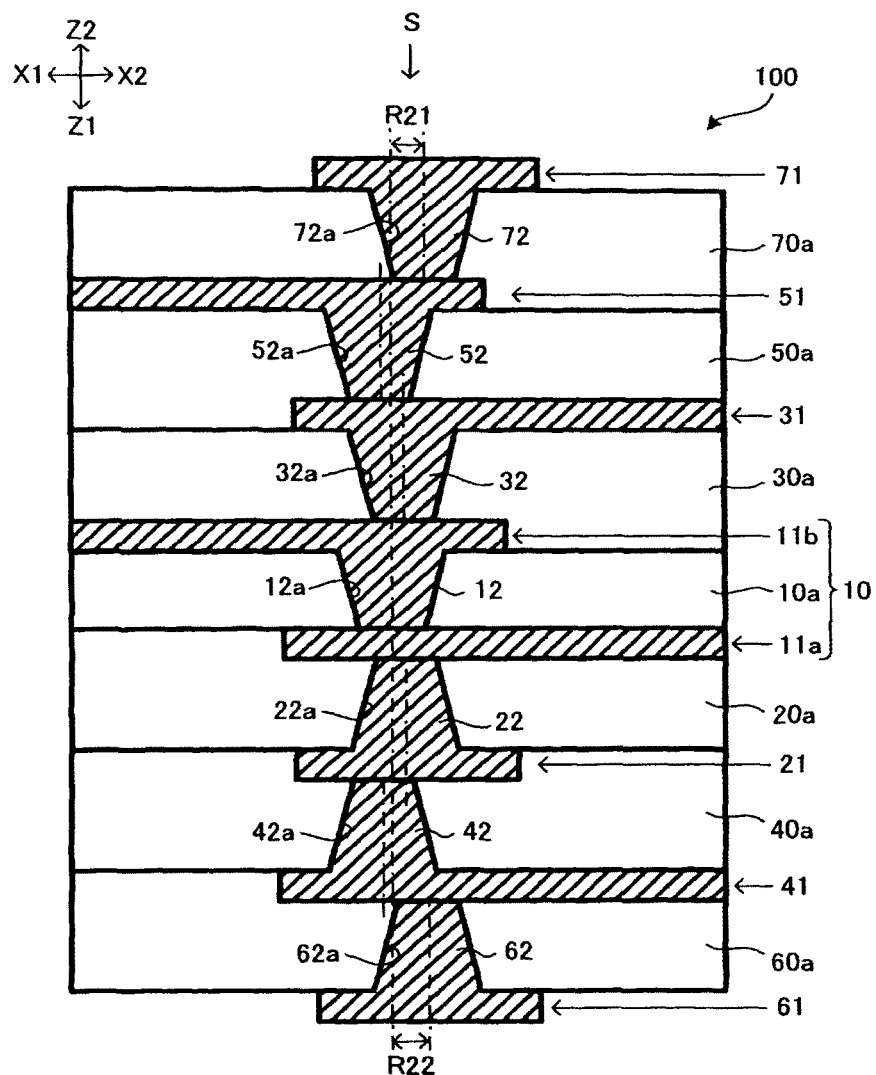
FIG. 16 is a cross-sectional view showing an example of a wiring board where the position of an outer-layer connection conductor on one side and the position of an outer-layer connection conductor on the other side are shifted in substantially the same direction from the position of a connection conductor in a core substrate, while inner-layer connection conductors are not positioned between the connection conductor in the core substrate and the outer-layer connection conductors.

As shown in FIG. 16, the positions of filled conductors (62, 72) (outer-layer connection conductors) are preferred to be shifted from the position of filled conductor 12 (connection conductor in core substrate 10) in substantially the same direction on both sides of core substrate 10. In the example shown in FIG. 16, the position of filled conductor 62 on the first-surface side and the position of filled conductor 72 on the second-surface side are shifted toward X2 from the position of filled conductor 12. Namely, the position of filled conductor 62 and the position of filled conductor 72 are shifted in the same direction. The above-described effects such as suppressing cracks from occurring near the core are also expected by such a structure.

Figure 17:
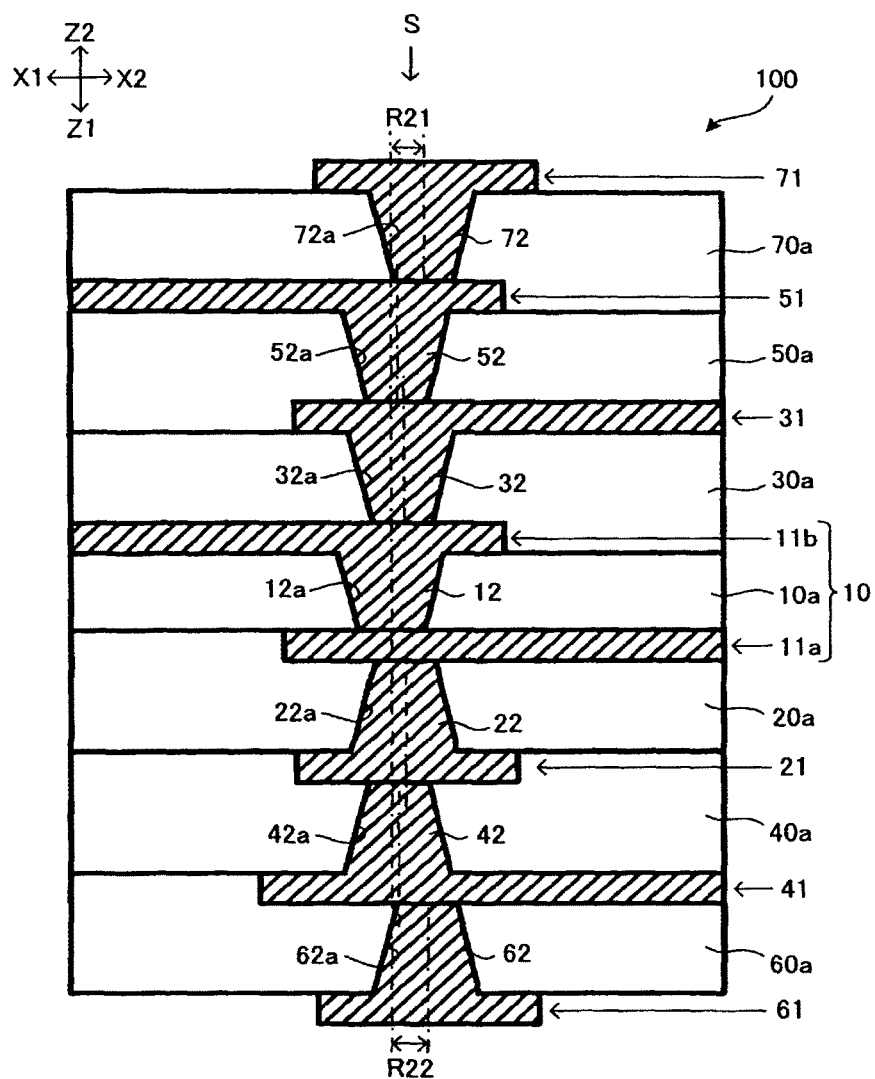
FIG. 17 is a cross-sectional view showing an example of a wiring board where the position of an outer-layer connection conductor on one side and the position of an outer-layer connection conductor on the other side are shifted in substantially the same direction from the position of a connection conductor in a core substrate, while inner-layer connection conductors are positioned between the connection conductor in the core substrate and the outer-layer connection conductors.

Moreover, in such a structure, inner-layer connection conductors in buildup sections are preferred to be positioned between the connection conductor in core substrate 10 and outer-layer connection conductors on both sides of core substrate 10, as shown in FIG. 17. In the example in FIG. 17, filled conductors (22, 42) (inner-layer connection conductors in the first-surface side) are positioned between filled conductor 12 (the connection conductor in core substrate 10) and filled conductor 62 (outer-layer connection conductor in the first-surface side) (range R21) in the direction (direction X) in which filled conductor 62 is shifted. In addition, filled conductors (32, 52) (inner-layer connection conductors in the second-surface side) are positioned between filled conductor 12 (the connection conductor in core substrate 10) and filled conductor 72 (outer-layer connection conductor in the second-surface side) (range R22) in the direction (direction X) in which filled conductor 72 is shifted. If such a structure is employed, that effects such as suppressing cracks from occurring near the core are enhanced, compared with situations in which filled conductors (42, 52) are positioned outside ranges (R21, R22) (see FIG. 16).

Horizontal cross-sectional shapes (on the X-Y plane) of via holes, through holes or lands in each layer are not limited specifically.

Figure 18A:
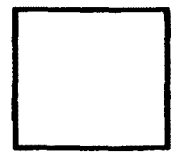
FIG. 18A is a view of a first alternative example showing a horizontal cross-sectional shape of via holes and through holes.

In addition to a perfect circle, those cross sections may be formed to be a square, as shown in FIG. 18A, for example, or any other regular polygon such as a regular hexagon, a regular octagon or the like. Also, the shape of angles of such polygons is not limited specifically; for example, it may be a right angle, an acute angle or an obtuse angle, or it may even be roundish. However, to prevent thermal stress from being concentrated, it is preferred that the angles be roundish.

Figure 18B:
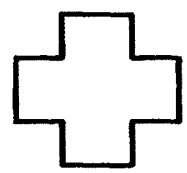
FIG. 18B is a view of a second alternative example showing a horizontal cross-sectional shape of via holes and through holes.
Figure 18C:
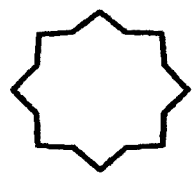
FIG. 18C is a view of a third alternative example showing a horizontal cross-sectional shape of via holes and through holes.

Also, the above horizontal cross-sectional shapes may be oval, rectangular, triangular or the like. Alternatively, as shown in FIG. 18B or 18C, shapes such as a cross or a regular polygonal star formed by drawing straight lines to radiate out from the center (shapes in which multiple spokes are positioned in a radial pattern) may be effective as the shapes of the above horizontal cross sections.

Figure 19:
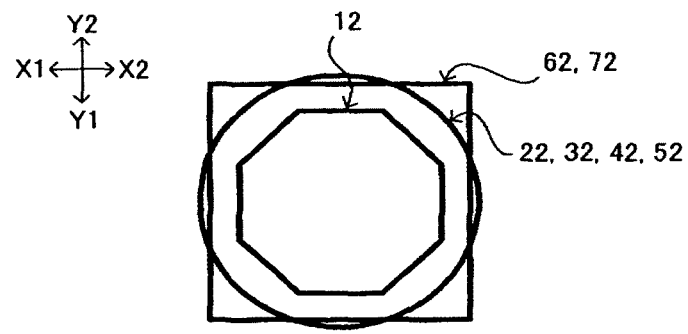
FIG. 19 is a view showing an example in which asymmetrical shapes are combined for via holes to form a filled-stack structure.

The above shapes may be freely combined to be used as the shapes of via hole (12a) and the like which form filled-stack structure "S." For example, as shown in FIG. 19, different shapes may be combined for filled conductors and their lands.

Figure 20A:
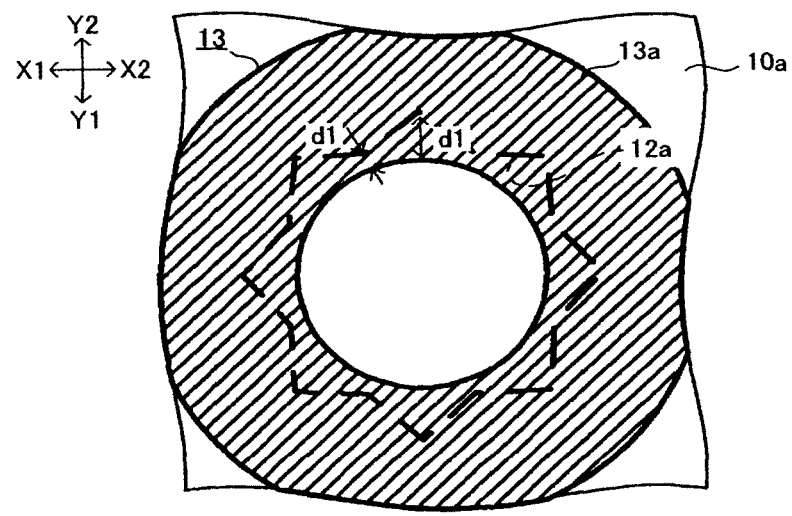
FIG. 20A is a view of another example showing a measurement relationship between the metal foil of a land on a core insulation layer and a via hole.
Figure 20B:
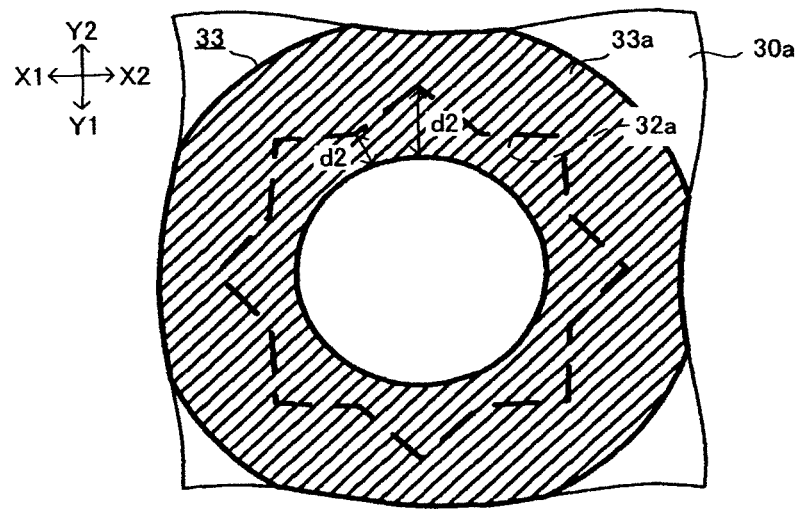
FIG. 20B is a view of another example showing a measurement relationship between the metal foil of a land on an interlayer insulation layer on the core insulation layer and a via hole.

In addition, the horizontal cross section of a connection conductor and the horizontal cross section of its land may be formed different from each other. For example, as shown in FIGS. 20A and 20B, the horizontal cross section of via holes (12a, 32a) may be a regular polygonal star, and the horizontal cross section of lands (13, 33) (metal foils 13a, 33a) may be a perfect circle. In such a case, protruding amounts (d1, d2) are not substantially constant in their respective circumferential directions of via holes (12a, 32a). Thus, for example, if the average value of protruding amount (d1) is set smaller than the average value of protruding amount (d2), corner cracking near the core is effectively suppressed as described previously.

Vertical cross sections of via holes and through holes in each layer may also be formed freely.

Figure 21A:
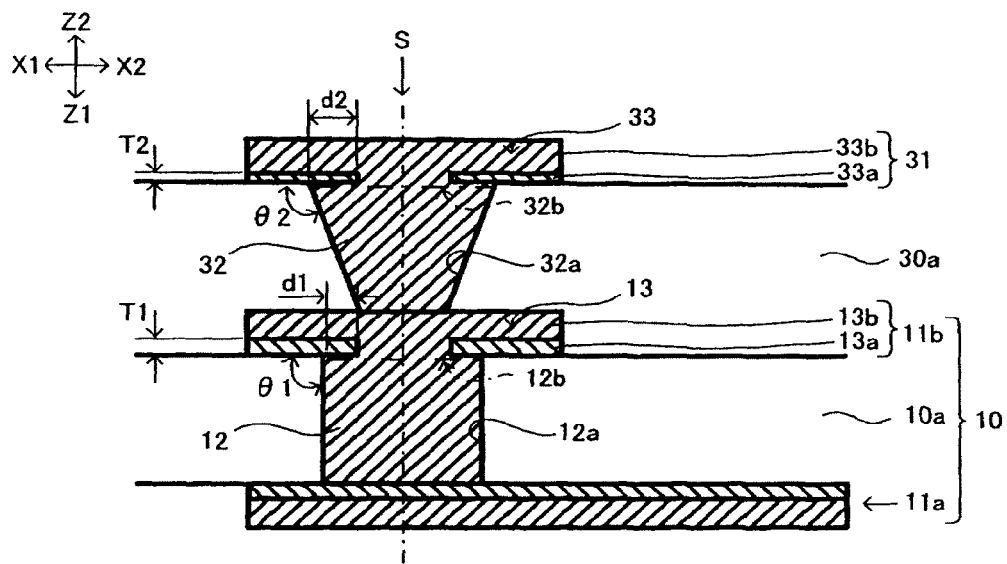
FIG. 21A is a view of another example showing a vertical cross-sectional shape of via holes and through holes.

For example, as shown in FIG. 21A, via holes (12a) in the core section and filled conductors 12 may be formed to be a cylinder.

Figure 21B:
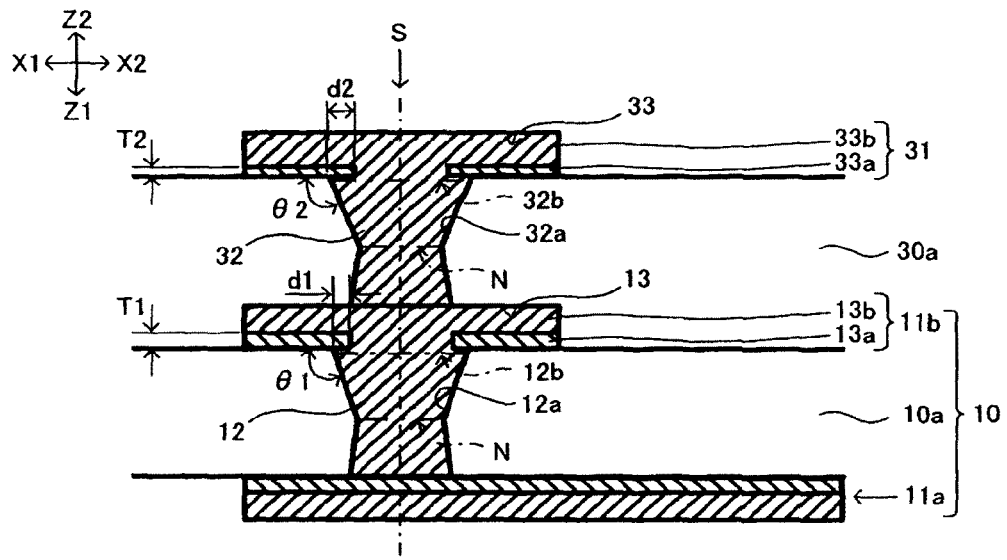
FIG. 21B is a view of yet another example showing a vertical cross-sectional shape of via holes and through holes.

Furthermore, as shown in FIG. 21B, via holes (12a, 32a) and filled conductors (12, 32) may be formed like an hourglass. In such a structure, since the width of the narrowed portion positioned between the opening portions on the first and second surfaces is set smaller than the width of the opening portions on both sides, the results of filling plating are improved. Also, as a result, flat features on the surfaces are enhanced. In addition, since side surfaces of filled conductors (12, 32) are slanted, contact areas increase between insulation layer (10a) or (30a) and filled conductors 12 or 32. Thus, their adhesive strength improves. Via holes (22a, 42a, 52a, 62a, 72a) and through holes (102a) may also be formed like an hourglass.

As described previously, to enhance connection reliability between filled conductor 12 in core substrate 10 and filled conductor 32 in insulation layer (30a), taper angle (θ1) of via hole (12a) in core substrate 10 is preferred to be set smaller than taper angle (θ2) of via hole (32a) in a buildup section. However, such a structure is not always required. For example, via hole (12a) in the core section and via hole (22a) in a buildup section may each be formed to be a cylinder. Moreover, the shape of through holes (102a) or the like may also be formed to be a cylinder or an hourglass.

The conductive-layer structure on each layer is not limited to the above triple-layer structure. For example, it may be a double-layer structure of metal foil and either electroless plated film or electrolytic plated film. In addition, the filled-conductor structure in each layer is not limited to being a double-layer structure of electroless plated film and electrolytic plated film. For example, it may be formed only with electroless plated film or electrolytic plated film.

Figure 22A:
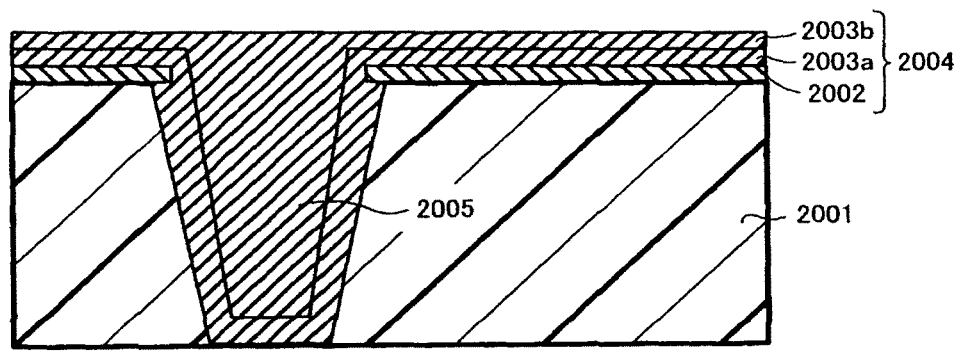
FIG. 22A is a view showing a first structure of a conductive layer and a connection conductor.

For example, in the above embodiment, the structure of conductive layer (11a) and the like was set to be triple layered such as conductive layer 2004 shown in FIG. 22A, in which metal foil 2002 (such as copper foil), electroless copper-plated film (2003a), for example, and electrolytic copper-plated film (2003b), for example, are laminated on insulation layer 2001 in that order. Also, the structure of filled conductors 22 and the like were set to be double layered such as filled conductor 2005 shown in FIG. 22A, which is formed with electroless plated film (2003a) and electrolytic plated film (2003b).

Figure 22B:
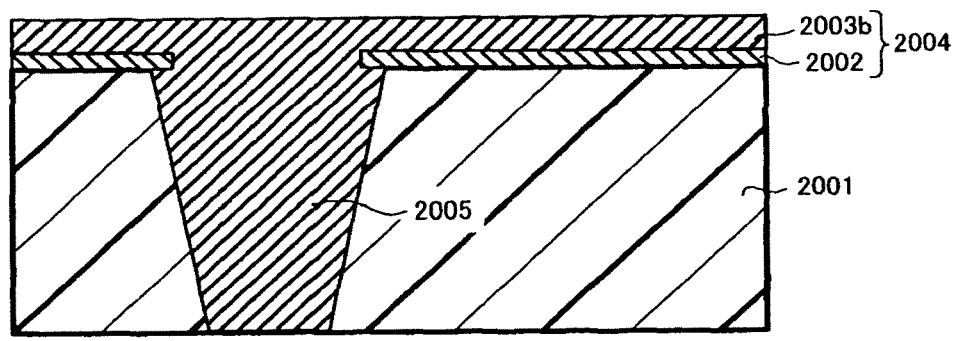
FIG. 22B is a view showing a second structure of a conductive layer and a connection conductor.

However, the structure of the above conductive layer (11a) and the like is not limited to the above, and it may be double layered such as conductive layer 2004 shown in FIG. 22B by omitting electroless plated film (2003a), for example. Moreover, the structure of filled conductors 22 and the like may also be formed with electrolytic plated film (2003b) alone.

FIGS. 22A and 22B show via conductors, but the same structures may be used for conformal conductors 102 (through-hole conductors). Here, if electroless plated film (2003a) or the like is omitted, there is a concern that adhesiveness of conductive layers decreases. Thus, surface treatment is preferred to be conducted on insulation layer 2001 (insulation layer 10a or the like) to enhance adhesiveness.

Filled conductors 12 are not limited to via conductors. For example, as shown in FIG. 23 and FIG. 24 (partially enlarged view of FIG. 23), filled conductors 12 may be through-hole conductors. In such a case, filled conductors 12 and conductive layers (11a, 11b) on both sides of insulation layer (10a) are at least partially contiguous (for example, at plated portions). In the example shown in FIG. 24, filled conductors 12 are formed by filling plating in through holes (12c). Such filled conductors 12 (through-hole conductors) may be formed by immersion plating after through holes (12c) are formed in insulation layer (10a), for example. In the example in FIG. 24, through holes (12c) in an hourglass shape are shown, but through holes (12c) may be formed freely. Through holes (12c) may be formed by irradiating laser light from one side of core substrate 10, or by irradiating laser light simultaneously from both sides of core substrate 10. Moreover, through holes (12c) may also be formed after forming holes with bottom portions (non-penetrating holes) by irradiating laser light from one side of core substrate 10, and then by irradiating laser light from the other side to penetrate through the bottom portions.

In the example shown in FIG. 24, conductive layer (11a) includes lands 14 of filled conductors 12, and conductive layer 21 includes lands 23 of filled conductors 22. Lands 14 are formed on insulation layer (10a) (on the first-surface side) and lands 23 are formed on insulation layer (20a). Lands 14 are formed with metal foil (14a) (such as copper foil) and plated film (14b) made of copper, for example, formed on metal foil (14a). Lands 23 are formed with metal foil (23a) (such as copper foil) and plated film (23b) made of copper, for example, formed on metal foil (23a). The thickness of each of the above conductive layers is the sum of the thickness of the metal foil and the thickness of the plated film.

Here, metal foil (14a) of lands 14 on the first-surface side of insulation layer (10a) is preferred to be thicker than metal foil (23a) of lands 23 on upper-layer insulation layer (20a) (on the first-surface side). In such a structure, since metal foil (14a) on core substrate 10 is set thicker, thermal stress near the core is mitigated by metal foil (14a), the same as in the above embodiment. Moreover, as in the above embodiment, if metal foils (13a, 33a) on the second-surface side are set in the same relationship, their combined effects are expected.

Thickness (T3) of metal foil (14a) is preferred to be 5 μm or greater, for example, 7.5 μm. Thickness (T4) of metal foil (23a) is preferred to be 4.5 μm or less, for example, 4.5 μm. Metal foils (14a, 23a) with such measurements may be formed by using thin copper foil. Alternatively, they may also be formed by using thick copper foil and by etching to adjust the thickness.

By contrast, plated film (14b) of lands 14 (lands on the core insulation layer) is set thinner than plated film (23b) of lands 23 on insulation layer (20a) (interlayer insulation layer on the core insulation layer). In such a structure, since plated film (14b) on core substrate 10 is set thinner, plating time to obtain the required conductor thickness decreases while manufacturing core substrate 10. As a result, the production efficiency of core substrate 10 is enhanced. Furthermore, as in the above embodiment, if plated films (13b, 33b) on the second-surface side are set in the same relationship, their combined effects are expected.

At first-surface side opening portion (22b) of via hole (22a) (the side toward which the diameter increases) in insulation layer (20a) (interlayer insulation layer on the core insulation layer), taper angle (θ4) toward the second-surface side (the side toward which the diameter decreases) is set greater than taper angle (θ3) toward the second-surface side at first-surface side opening portion (12d) of through hole (12c) in insulation layer (10a). In such a structure, since the taper degree of through hole (12c) in core substrate 10 is gentler than the taper degree of via hole (22a) in a buildup section, thermal stress caused by heat cycles is mitigated near the core, the same as in the above embodiment. Also, as a result, connection reliability is enhanced between filled conductor 12 in core substrate 10 and filled conductor 22 in insulation layer (20a). Moreover, as in the above embodiment, if taper angles (θ1, θ2) at the second-surface side are set in the same relationship as above, the combined effects are expected.

In addition, the amount (protruding amount d3) which metal foil (13a) of land 13 (land on the core insulation layer) protrudes inward from the periphery of through hole (12c) is set smaller than the amount (protruding amount d4) which metal foil (23a) of land 23 on insulation layer (20a) (interlayer insulation layer on the core insulation layer) protrudes inward from the periphery of via hole (22a). In such a structure, since protruding amount (d3) of metal foil (14a) on core substrate 10 is set smaller than protruding amount (d4) of metal foil (23a) on insulation layer (20a) in a buildup section, corner cracking is effectively suppressed near the core. Moreover, as in the above embodiment, if protruding amounts (d1, d2) on the second-surface side are set in the same relationship, the combined effects are expected.

Measurement examples of the example shown in FIG. 24 are as follows: in via hole (12a), the diameter at first-surface side opening portion (12d) and second-surface side opening portion (12b) is 75 μm, for example; the diameter at first-surface side opening portion (22b) of via hole (22a) is 75 μm, for example; and the diameter at second-surface side opening portion (32b) of via hole (32a) is 75 μm, for example; taper angles (θ1, θ3) are approximately 110°, for example; taper angles (θ2, θ4) are approximately 120°, for example; protruding amounts (d1, d3) are approximately 6.5 μm, for example; and protruding amounts (d2, d4) are approximately 22 μm, for example.

Figure 25:
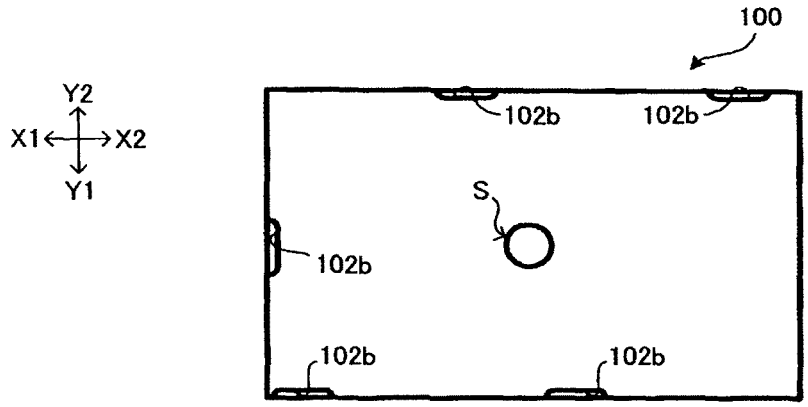
FIG. 25 is a view showing an example in which notches are used instead of through holes.
Figure 26:
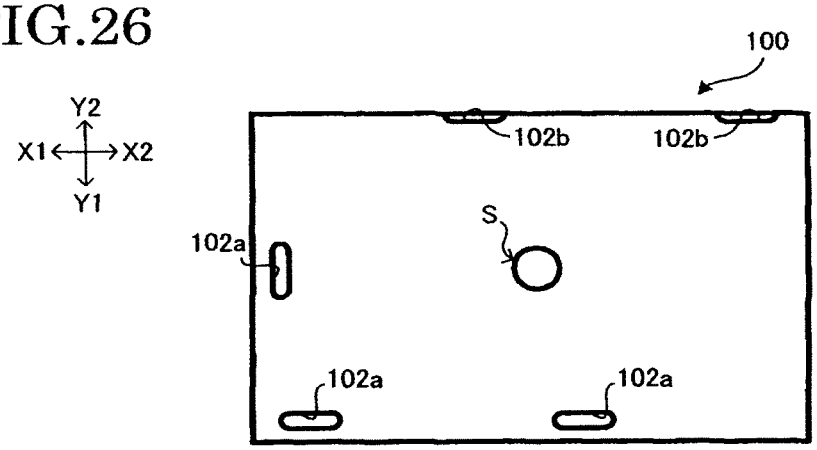
FIG. 26 is a view showing an example in which both through holes and notches are used.
Figure 27:
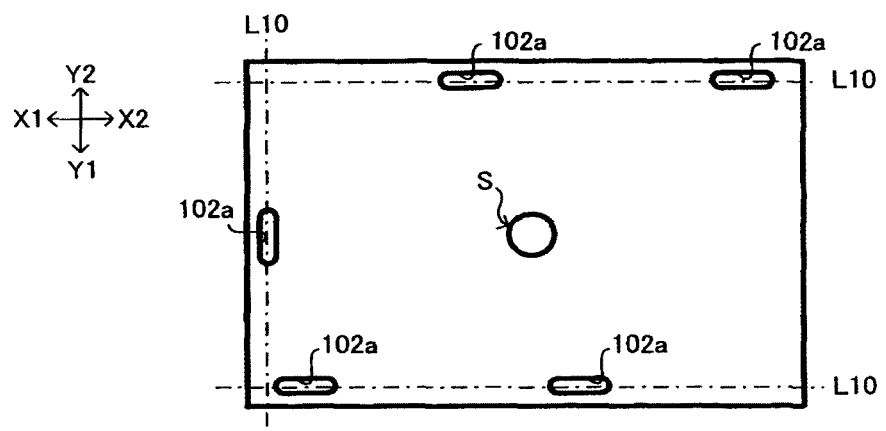
FIG. 27 is a view showing an example of a method for forming notches.

As shown in FIG. 25 (a view corresponding to FIG. 2), notches (102b) which penetrate through wiring board 100 in directions Z (lamination directions) may be used instead of through holes (102a). Notches (102b) are formed on side surfaces of wiring board 100. On the wall surfaces of notches (102b), conformal conductors 102 (see FIG. 1) are formed. Also, as shown in FIG. 26, both through holes (102a) and notches (102b) may be used. For example, as shown in FIG. 27, notches (102b) may be formed by dividing (cutting) through holes (102a) at line (L10) after through holes (102a) are formed. However, a method for forming notches (102b) is not limited to the above, and any other method may be taken.

Figure 28A:
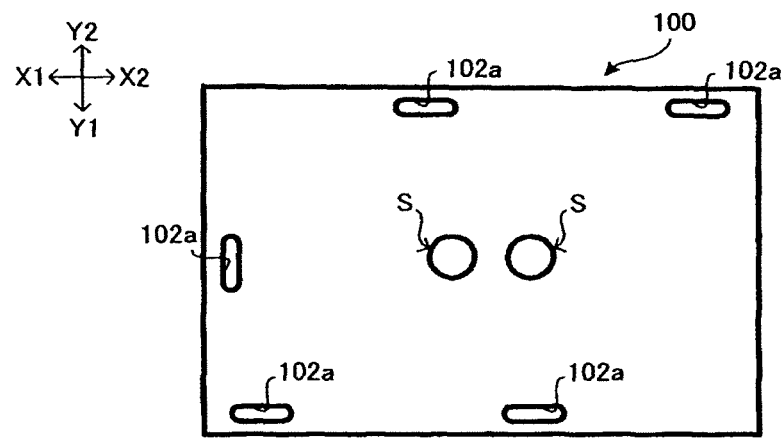
FIG. 28A is a view showing an example of a wiring board having multiple filled-stack structures.
Figure 28B:
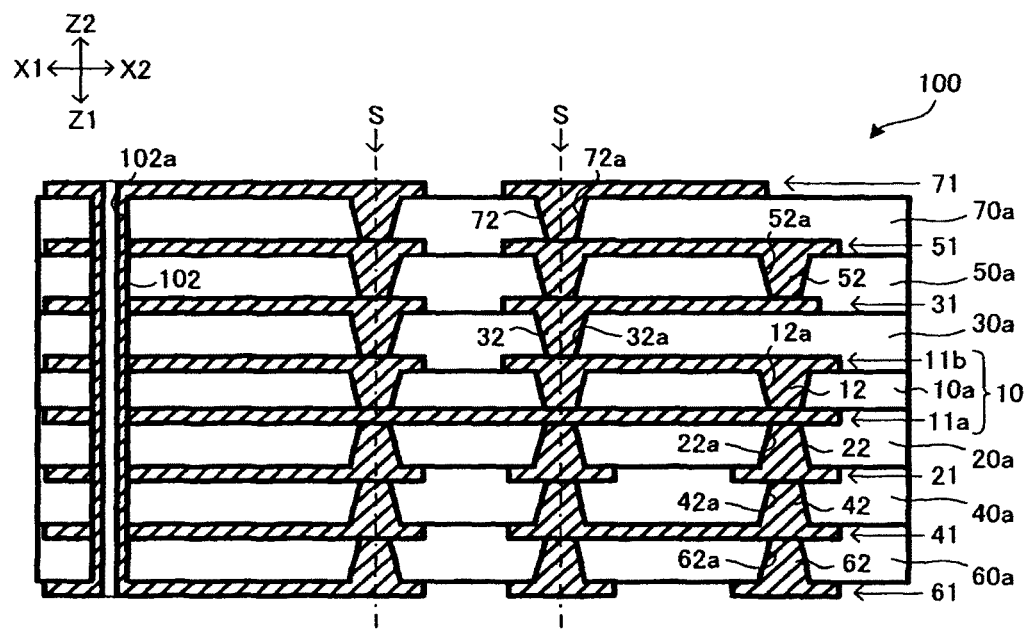
FIG. 28B is a cross-sectional view of FIG. 28A.

The number of filled-stack structures "S" is not limited to one, and it may be any other number. For example, as shown in FIG. 28A and FIG. 28B (cross-sectional view of FIG. 28A), wiring board 100 may have multiple (for example, two) filled-stack structures "S."

Wiring board 100 may have electronic components and be set as an electronic device.

Figure 29:
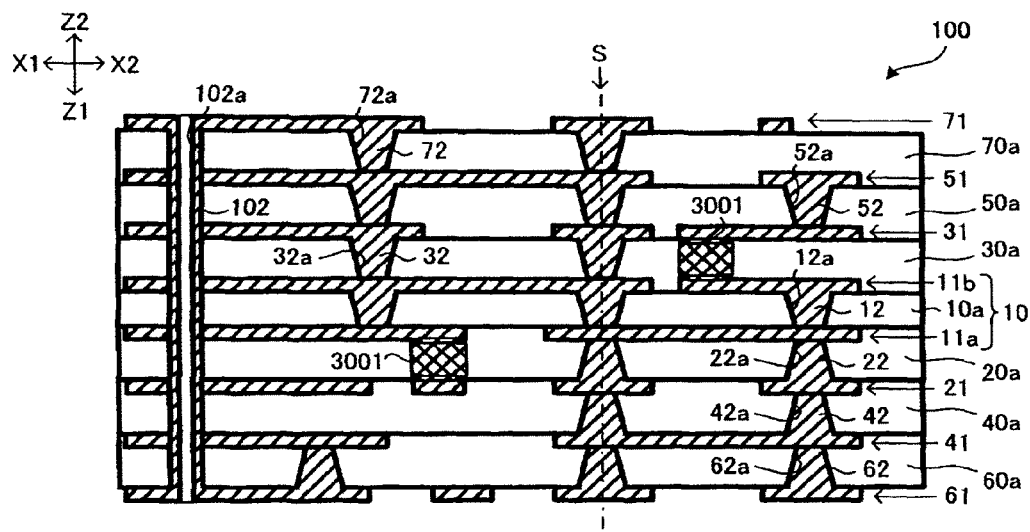
FIG. 29 is a view showing an example of a wiring board with built-in electronic components.

For example, as shown in FIG. 29, electronic component 3001 may be built into wiring board 100. In the example shown in FIG. 29, two electronic components 3001 are built into the wiring board, but the number of electronic components may be determined freely. For example, it is an option to build only one electronic component into wiring board 100. Using wiring board 100 with built-in electronic components, an electronic device becomes highly functional.

Figure 30:
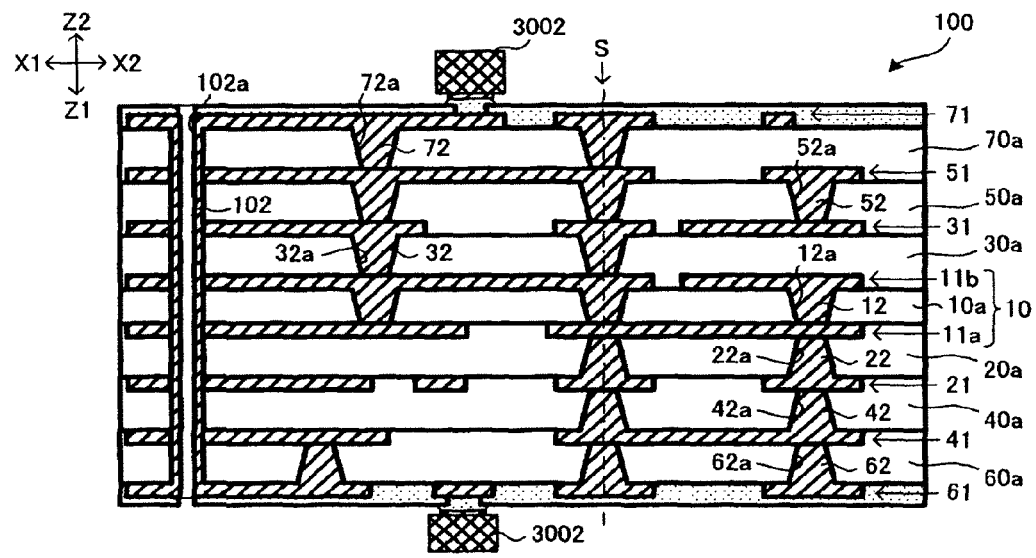
FIG. 30 is a view showing an example of a wiring board with electronic components mounted on its surfaces.

Also, as shown in FIG. 30, for example, electronic component 3002 may be mounted on a surface of wiring board 100. In an example shown in FIG. 30, electronic components 3002 are mounted on both surfaces of wiring board 100, but electronic component 3002 could be mounted only on one surface of wiring board 100. In addition, the number of electronic components may be determined freely. For example, it is an option to mount only one electronic component on wiring board 100.

Regarding other factors, the structure of wiring board 100, as well as type, performance, size, quality, shape, number of layers, positioning and so forth of the elements of such a structure, may be modified freely within a scope that does not deviate from the gist of the present invention.

The number of layers in wiring board 100 is not limited specifically. For example, to achieve high functionality, multilayered wiring boards with even more layers may be formed by further continuing lamination after the structure shown in FIG. 1 is completed.

The material for each wiring layer is not limited to the above, and may be modified according to usage requirements or the like. For example, metal other than copper may be used as the material for wiring layers. Also, the material for each insulation layer is not limited to a specific type. However, as for resins to form insulation layers, thermosetting resins or thermoplastic resins are preferred. As for thermosetting resins, for example, other than epoxy resin, the following may be used: imide resin (polyimide), BT resin, allyl polyphenylene ether resin (A-PPE resin) or aramid resin. Also, as for thermoplastic resins, for example, liquid-crystal polymer (LCP), PEEK resin or PTFE resin (fluoro resin) may be used. Such materials are preferred to be selected according to requirements from the viewpoint of insulation, dielectric properties, tolerance to heat, mechanical features and so forth. In addition, the above resins may contain additives such as a curing agent, a stabilizer, filler or the like. Alternatively, each conductive layer and each insulation layer may be formed with multiple layers having different materials.

The steps in the above embodiment are not limited to the order and contents shown in the flowchart in FIG. 8. The order and contents may be modified freely within a scope that does not deviate from the gist of the present invention. Also, some steps may be omitted according to usage requirements or the like.

The above embodiment, modified examples and the like may be combined freely.

A wiring board according to one aspect of the present invention has a conductive layer and an interlayer insulation layer alternately laminated on at least one side of a core insulation layer. In such a wiring board, the core insulation layer and the interlayer insulation layer have connection conductors each formed by filling plating in a hole, the connection conductor in the core insulation layer and the connection conductor in the interlayer insulation layer are stacked, lands for the connection conductors are formed on the core insulation layer and the interlayer insulation layer, each being made of metal foil and plating on the metal foil, and the metal foil of the land on the core insulation layer is made thicker than the metal foil of the land on the interlayer insulation layer on the core insulation layer.

A method for manufacturing a wiring board according to another aspect of the present invention includes the following: forming metal foil on a core insulation layer; forming a hole in the core insulation layer; filling plating in the hole in the core insulation layer; forming an interlayer insulation layer on at least one side of the core insulation layer; on the interlayer insulation layer, forming metal foil which is thinner than the metal foil on the core insulation layer; forming a hole in the interlayer insulation layer so that it is stacked on the hole in the core insulation layer; and filling plating in the hole in the interlayer insulation layer.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a core insulation layer having a hole and a connection conductor formed in the hole of the core insulation layer, the connection conductor of the core insulation layer comprising a plating filling the hole of the core insulation layer; and
   an interlayer insulation layer laminated on one side of the core insulation layer, the interlayer insulation layer having a hole and a connection conductor formed in the hole of the interlayer insulation layer, the connection conductor of the interlayer insulation layer comprising a plating filling the hole of the interlayer insulation layer, wherein the connection conductor of the interlayer insulation layer is stacked on the connection conductor of the core insulation layer, the connection conductor of the core insulation layer has a land portion formed on the core insulation layer and comprising a metal foil and a plating on the metal foil of the land portion on the core insulation layer, the connection conductor of the interlayer insulation layer has a land portion formed on the interlayer insulation layer and comprising a metal foil and a plating on the metal foil of the land portion on the interlayer insulation layer, and the metal foil of the land portion on the core insulation layer has a thickness which is thicker than a thickness of the metal foil of the land portion on the interlayer insulation layer.

2. The wiring board according to claim 1, wherein the thickness of the metal foil of the land portion on the core insulation layer is set at 5 μm or greater.

3. The wiring board according to claim 1, wherein the holes in the core insulation layer and the interlayer insulation layer have respective diameters which decrease from the one side of the core insulation layer toward an opposite side, and the hole of the interlayer insulation layer has a taper angle which is set greater than a taper angle of the hole of the core insulation layer.

4. The wiring board according to claim 1, wherein the metal foil of the land portion on the core insulation layer has a protruding portion which protrudes inward from a periphery of the hole of the core insulation layer, the metal foil of the land portion on the interlayer insulation layer has a protruding portion which protrudes inward from a periphery of the hole of the interlayer insulation layer, the protruding portion of the metal foil of the land portion on the core insulation layer is set smaller than the protruding portion of the metal foil of the land portion on the interlayer insulation layer.

5. The wiring board according to claim 1, wherein the interlayer insulation layer comprises a core material impregnated with a resin.

6. The wiring board according to claim 1, further comprising:
a plurality of conductive layers; and
a plurality of insulation layers laminated on the interlayer insulation layer,
wherein the plurality of conductive layers includes a conductive layer formed between the core insulation layer and the interlayer insulation layer, a conductive layer formed between the interlayer insulation layer and the plurality of insulation layers, and conductive layers alternately formed between the insulation layers, the plurality of insulation layers has a plurality of connection conductors, respectively, and the connection conductors of the insulation layers are stacked on the connection conductor of the interlayer insulation layer.

7. The wiring board according to claim 6, further comprising:
an opposite interlayer insulation layer laminated on an opposite side of the core insulation layer, the opposite interlayer insulation layer having a hole and a connection conductor formed in the hole of the opposite interlayer insulation layer, the connection conductor of the opposite interlayer insulation layer comprising a plating filling the hole of the opposite interlayer insulation layer;
a plurality of opposite conductive layers formed on the opposite side of the core insulation layer; and
a plurality of opposite insulation layers laminated on the opposite interlayer insulation layer,
wherein the connection conductor of the opposite interlayer insulation layer is stacked on the connection conductor of the core insulation layer, the plurality of opposite conductive layers includes a conductive layer formed between the core insulation layer and the opposite interlayer insulation layer, a conductive layer formed between the opposite interlayer insulation layer and the plurality of opposite insulation layers, and the opposite conductive layers alternately formed between the opposite insulation layers, the plurality of opposite insulation layers has a plurality of connection conductors, respectively, and the connection conductors of the opposite insulation layers are stacked on the connection conductor of the opposite interlayer insulation layer.

8. The wiring board according to claim 7, wherein the connection conductors of the interlayer insulation layer and insulation layers are shifted substantially in one direction from the connection conductor of the core insulation layer, and the opposite connection conductors of the opposite interlayer insulation layer and opposite insulation layers are shifted substantially in the one direction from the connection conductor of the core insulation layer.

9. The wiring board according to claim 7, wherein the plurality of connection conductors of the insulation layers includes an outermost connection conductor which is shifted substantially in one direction from the connection conductor of the core insulation layer, and the plurality of opposite connection conductors of the opposite insulation layers includes an outermost connection conductor which is shifted substantially in the one direction from the connection conductor of the core insulation layer.

10. The wiring board according to claim 1, further comprising:
a plurality of conductive layers; and
a plurality of insulation layers laminated on the interlayer insulation layer,
wherein the plurality of conductive layers includes a conductive layer formed between the core insulation layer and the interlayer insulation layer, a conductive layer formed between the interlayer insulation layer and the plurality of insulation layers, and conductive layers alternately formed between the insulation layers, and the plurality of insulation layers has a plurality of connection conductors, respectively.

11. The wiring board according to claim 10, further comprising:
an opposite interlayer insulation layer laminated on an opposite side of the core insulation layer, the opposite interlayer insulation layer having a hole and a connection conductor formed in the hole of the opposite interlayer insulation layer, the connection conductor of the opposite interlayer insulation layer comprising a plating filling the hole of the opposite interlayer insulation layer;
a plurality of opposite conductive layers formed on the opposite side of the core insulation layer; and
a plurality of opposite insulation layers laminated on the opposite interlayer insulation layer,
wherein the connection conductor of the opposite interlayer insulation layer is stacked on the connection conductor of the core insulation layer, the plurality of opposite conductive layers includes a conductive layer formed between the core insulation layer and the opposite interlayer insulation layer, a conductive layer formed between the opposite interlayer insulation layer and the plurality of opposite insulation layers, and the opposite conductive layers alternately formed between the opposite insulation layers, and the plurality of opposite insulation layers has a plurality of connection conductors, respectively.

12. The wiring board according to claim 1, further comprising a conductive layer formed between the core insulation layer and the interlayer insulation layer.

13. The wiring board according to claim 1, further comprising:
a plurality of insulation layers laminated on the interlayer insulation layer,
wherein the plurality of insulation layers has a plurality of connection conductors, respectively.

14. The wiring board according to claim 13, further comprising:
an opposite interlayer insulation layer laminated on an opposite side of the core insulation layer, the opposite interlayer insulation layer having a hole and a connection conductor formed in the hole of the opposite interlayer insulation layer, the connection conductor of the opposite interlayer insulation layer comprising a plating filling the hole of the opposite interlayer insulation layer; and
a plurality of opposite insulation layers laminated on the opposite interlayer insulation layer,
wherein the connection conductor of the opposite interlayer insulation layer is stacked on the connection conductor of the core insulation layer, and the plurality of opposite insulation layers has a plurality of connection conductors, respectively.

15. A method for manufacturing a wiring board, comprising:
forming a metal foil on one side of a core insulation layer;
forming a hole in the core insulation layer;
filling the hole in the core insulation layer with a plating such that a connection conductor is formed in the core insulation layer;
forming an interlayer insulation layer on the one side of the core insulation layer;
forming on the interlayer insulation layer a metal foil having a thickness which is thinner than a thickness of the metal foil on the core insulation layer;
forming a hole in the interlayer insulation layer such that the hole in the interlayer insulation layer is positioned on the connection conductor of the core insulation layer; and
filling the hole in the interlayer insulation layer with a plating such that a connection conductor is formed in the interlayer insulation layer.

16. The method for manufacturing a wiring board according to claim 15, further comprising etching the metal foil on the interlayer insulation layer such the thickness of the metal foil on the interlayer insulation layer becomes thinner than the thickness of the metal foil on the core insulation layer.

17. The method for manufacturing a wiring board according to claim 15, further comprising forming a conductive layer on the one side of the core insulation layer.

18. The method for manufacturing a wiring board according to claim 15, wherein the forming of the hole in the core insulation layer comprises forming a diameter of the hole in the core insulation layer decreasing from the one side of the core insulation layer toward an opposite side, and the forming of the hole in the interlayer insulation layer comprises forming a diameter of the hole in the interlayer insulation layer decreasing from the one side of the core insulation layer toward the opposite side such that the hole of the interlayer insulation layer has a taper angle which is set greater than a taper angle of the hole of the core insulation layer.

19. The method for manufacturing a wiring board according to claim 17, further comprising:
forming a plurality of insulation layers having a plurality of connection conductors, respectively, such that the connection conductors of the insulation layers are stacked on the connection conductor of the interlayer insulation layer.

20. The method for manufacturing a wiring board according to claim 19, further comprising:
forming an opposite interlayer insulation layer on an opposite side of the core insulation layer;
forming an opposite connection conductor in the opposite interlayer insulation layer such that the opposite connection conductor is stacked on the connection conductor in the core insulation layer; and
forming a plurality of opposite insulation layers having a plurality of opposite connection conductors, respectively, such that the opposite connection conductors of the opposite insulation layers are stacked on the opposite connection conductor of the opposite interlayer insulation layer.

21. The method for manufacturing a wiring board according to claim 20, wherein the connection conductors of the interlayer insulation layer and insulation layers are shifted substantially in one direction from the connection conductor of the core insulation layer, and the opposite connection conductors of the opposite interlayer insulation layer and opposite insulation layers are shifted substantially in the one direction from the connection conductor of the core insulation layer.

* * * * *